United States Patent
Ma et al.

(10) Patent No.: US 11,784,239 B2
(45) Date of Patent: Oct. 10, 2023

(54) SUBFIN LEAKAGE SUPPRESSION USING FIXED CHARGE

(71) Applicant: Intel Corporation, Santa Clara, CA (US)

(72) Inventors: Sean T. Ma, Portland, OR (US); Aaron D. Lilak, Beaverton, OR (US); Justin R. Weber, Portland, OR (US); Harold W. Kennel, Portland, OR (US); Willy Rachmady, Beaverton, OR (US); Gilbert W. Dewey, Beaverton, OR (US); Cheng-Ying Huang, Portland, OR (US); Matthew V. Metz, Portland, OR (US); Jack T. Kavalieros, Portland, OR (US); Anand S. Murthy, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 827 days.

(21) Appl. No.: 16/341,020

(22) PCT Filed: Dec. 14, 2016

(86) PCT No.: PCT/US2016/066436
§ 371 (c)(1),
(2) Date: Apr. 10, 2019

(87) PCT Pub. No.: WO2018/111250
PCT Pub. Date: Jun. 21, 2018

(65) Prior Publication Data
US 2020/0044059 A1 Feb. 6, 2020

(51) Int. Cl.
*H01L 29/06* (2006.01)
*H01L 29/78* (2006.01)
(Continued)

(52) U.S. Cl.
CPC .... *H01L 29/66795* (2013.01); *H01L 29/0665* (2013.01); *H01L 29/408* (2013.01); *H01L 29/785* (2013.01); *H01L 29/7855* (2013.01)

(58) Field of Classification Search
CPC .............. H01L 29/0665; H01L 29/408; H01L 29/66795; H01L 29/785; H01L 29/7855
See application file for complete search history.

(56) References Cited

U.S. PATENT DOCUMENTS 8,741,722 B2    6/2014    Chang et al.
9,881,918 B1 *    1/2018    Huang ............ H01L 21/823431
(Continued)

FOREIGN PATENT DOCUMENTS

WO    2016105437 A1    6/2016
WO    2016179113 A1    11/2016
(Continued)

OTHER PUBLICATIONS

PCT International Search Report and Written Opinion for PCT Application No. PCT/US2016/064298 dated Aug. 28, 2017; 8 pages.
(Continued)

*Primary Examiner* — Herve-Louis Y Assouman
*Assistant Examiner* — Christopher M Roland
(74) *Attorney, Agent, or Firm* — Akona IP

(57) ABSTRACT

Disclosed herein are tri-gate transistor arrangements, and related methods and devices. For example, in some embodiments, a transistor arrangement may include a fin stack shaped as a fin extending away from a base, and a subfin dielectric stack. The fin includes a subfin portion and a channel portion, the subfin portion being closer to the base than the channel portion. The subfin dielectric stack includes a transistor dielectric material, and a fixed charge liner
(Continued)

material disposed between the transistor dielectric material and the subfin portion of the fin.

20 Claims, 10 Drawing Sheets

(51) Int. Cl.
  *H01L 29/66* (2006.01)
  *H01L 29/40* (2006.01)

(56) References Cited

U.S. PATENT DOCUMENTS

| | | | |
|---|---|---|---|
| 2008/0157215 A1 | 7/2008 | Miyashita | |
| 2011/0186925 A1 | 8/2011 | Miyata | |
| 2012/0205746 A1 | 8/2012 | Wang | |
| 2012/0214299 A1 | 8/2012 | Chudzik et al. | |
| 2013/0119447 A1 | 5/2013 | Anderson et al. | |
| 2014/0117462 A1* | 5/2014 | Cheng | H01L 29/66818 257/410 |
| 2015/0171218 A1* | 6/2015 | Steigerwald | H01L 29/7855 438/587 |
| 2015/0311207 A1* | 10/2015 | Ching | H01L 21/823821 257/192 |
| 2015/0311336 A1* | 10/2015 | Ching | H01L 29/0607 438/157 |
| 2016/0056277 A1* | 2/2016 | Lee | H01L 29/66818 438/283 |
| 2016/0133696 A1* | 5/2016 | Yin | H01L 29/66803 257/402 |
| 2016/0148947 A1 | 5/2016 | Seo et al. | |
| 2016/0181161 A1 | 6/2016 | Song et al. | |
| 2016/0233319 A1* | 8/2016 | Lu | H01L 21/2255 |
| 2016/0254261 A1 | 9/2016 | Machkaoutsan et al. | |
| 2016/0268371 A1 | 9/2016 | Okano | |
| 2016/0329326 A1 | 11/2016 | Balakrishnan et al. | |
| 2017/0053825 A1* | 2/2017 | Seo | H01L 21/31144 |
| 2017/0133378 A1* | 5/2017 | Zhu | H01L 21/823807 |
| 2017/0250282 A1* | 8/2017 | Wu | H01L 29/785 |
| 2018/0350585 A1* | 12/2018 | Cai | H01L 29/66795 |
| 2019/0027601 A1* | 1/2019 | Gao | H01L 21/823821 |
| 2020/0127104 A1* | 4/2020 | Ando | H01L 29/408 |
| 2020/0185501 A1 | 6/2020 | Ma et al. | |
| 2020/0235013 A1* | 7/2020 | Lilak | H01L 21/823821 |

FOREIGN PATENT DOCUMENTS

| | | |
|---|---|---|
| WO | 2018101941 A1 | 6/2018 |
| WO | 2018111250 A1 | 6/2018 |

OTHER PUBLICATIONS

PCT International Search Report and Written Opinion of PCT Application No. PCT/US2016/066436 dated Aug. 23, 2017; 7 pages.

PCT Patent Application No. PCT/US2016/064298 filed Dec. 1, 2016; 61 pages.

USPTO Non-Final Office Action dated Jun. 11, 2020 in U.S. Appl. No. 16/341,010; 21 pages.

* cited by examiner

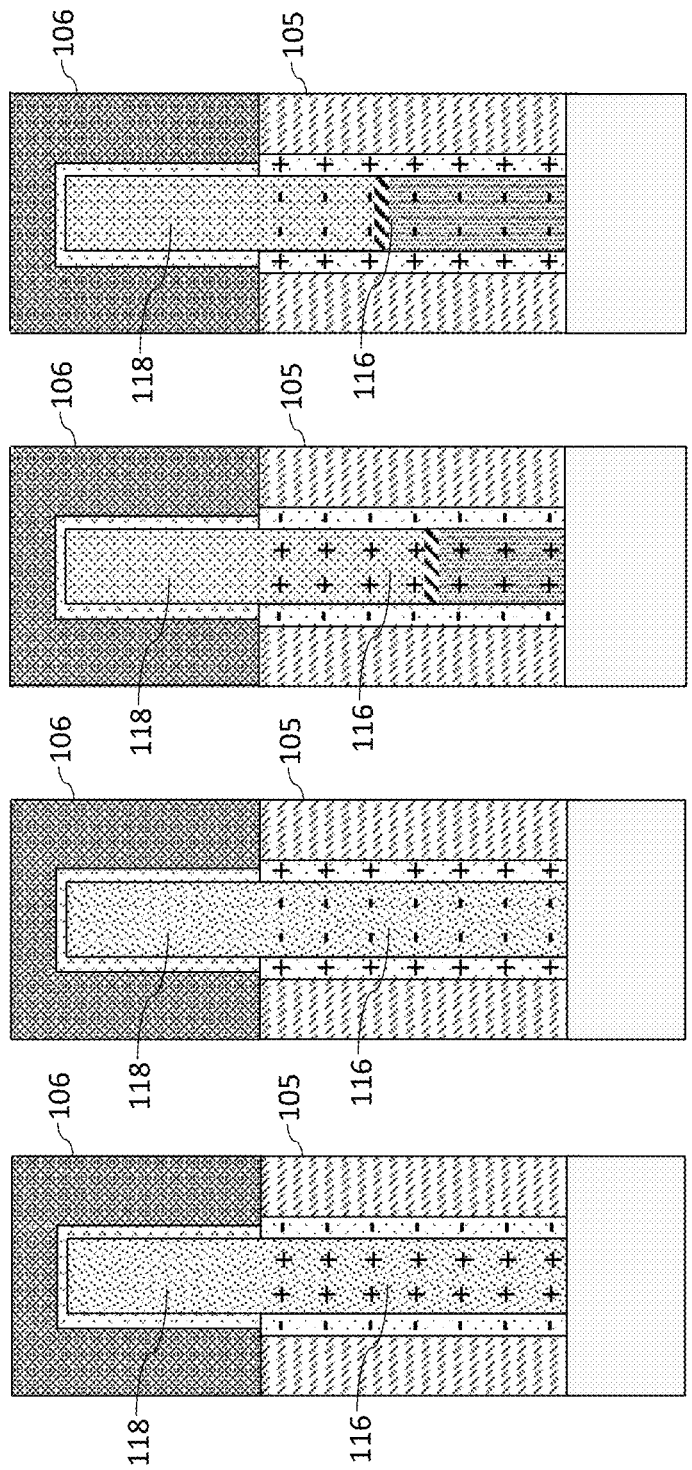

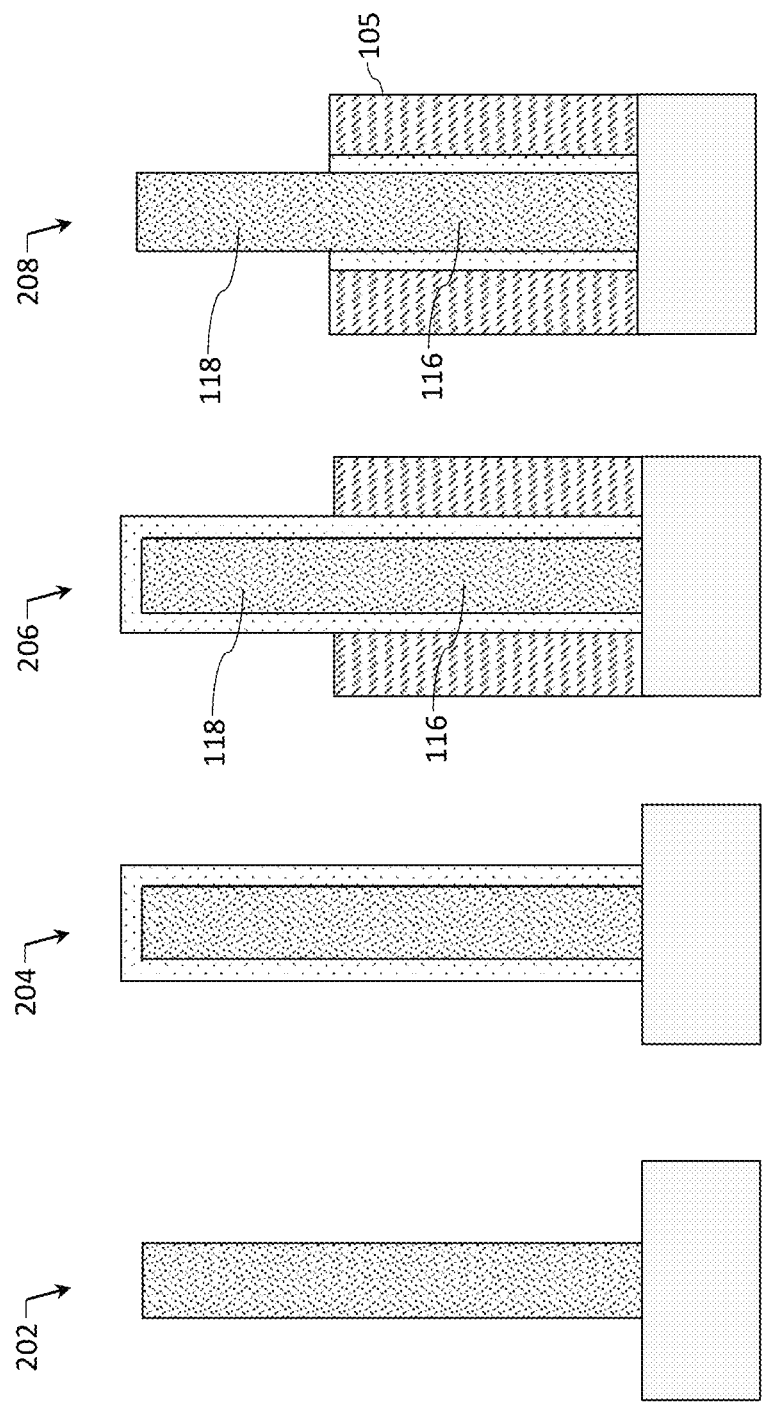

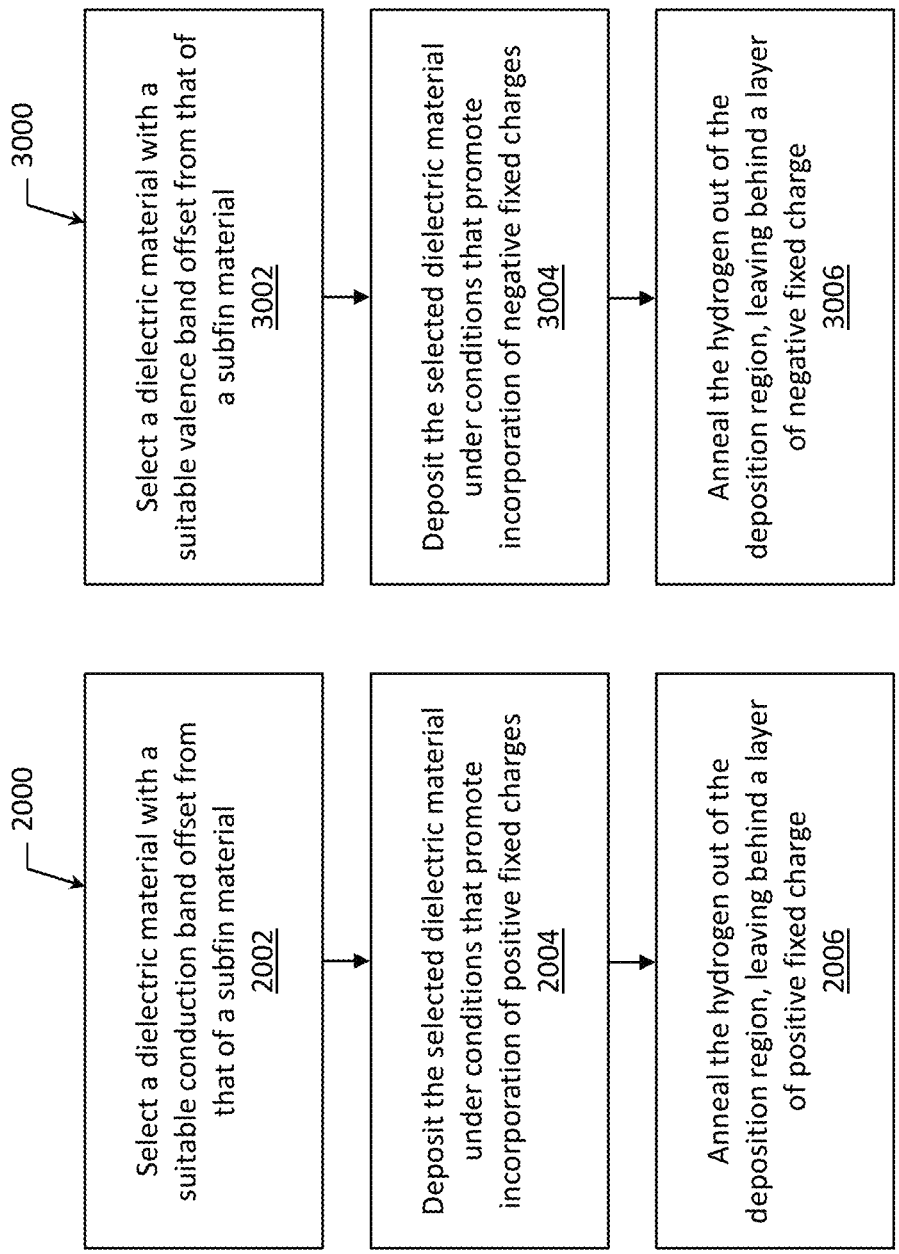

SUBFIN LEAKAGE SUPPRESSION USING FIXED CHARGE

BACKGROUND

Tri-gate transistors refer to transistors having a non-planar architecture where a fin, formed of one or more semiconductor materials, extends away from a base. Tri-gate transistors potentially improve performance relative to single-gate transistors and double-gate transistors.

In a tri-gate transistor, a portion of a fin that is closest to the base is enclosed by a transistor dielectric material. Such a dielectric material, typically an oxide, is commonly referred to as a "shallow trench isolation" (STI), and the portion of the fin enclosed by the STI is referred to as a "subfin portion" or simply a "subfin." A gate stack that includes at least a layer of a gate electrode metal and a layer of a gate dielectric is provided over the top and sides of the remaining upper portion of the fin (i.e. the portion above and not enclosed by the STI), thus wrapping around the upper portion of the fin and forming a three-sided gate of a tri-gate transistor. The portion of the fin over which the gate stack wraps around is referred to as a "channel portion" of the fin and is a part of an active region of the fin. The name "tri-gate" originates from the fact that, in use, such a transistor may form conducting channels on three "sides" of the channel portion of the fin. A source region and a drain region are provided on either side of the gate stack, forming, respectively, a source and a drain of such a transistor.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 3-6 are cross-sectional side views along a plane AA of the example arrangement shown in FIG. 1, in accordance with various embodiments.

FIGS. 8-11 illustrate various example stages in the manufacture of a tri-gate transistor with a fixed charge liner, in accordance with various embodiments.

FIG. 12 is a flow diagram of an example method of providing a positive fixed charge dielectric material of a fixed charge liner, in accordance with various embodiments.

FIG. 13 is a flow diagram of an example method of providing a negative fixed charge dielectric material of a fixed charge liner, in accordance with various embodiments.

DETAILED DESCRIPTION

Figure 1:
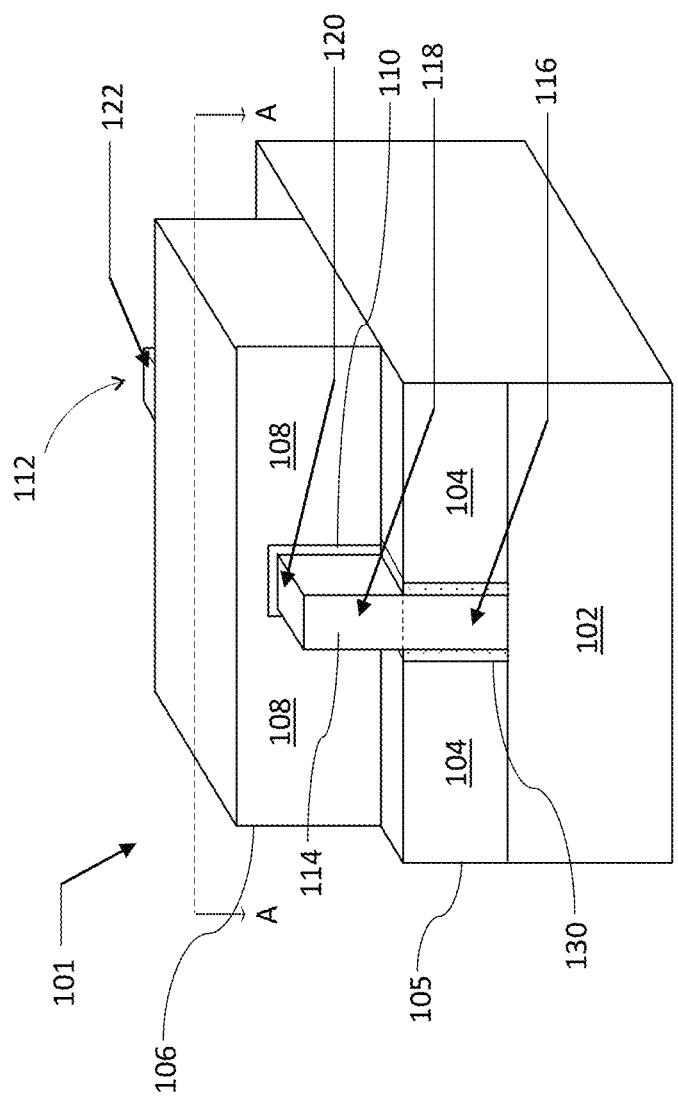
FIG. 1 is a perspective view of an example arrangement a tri-gate transistor having a fixed charge liner, in accordance with various embodiments.

Disclosed herein are tri-gate transistor arrangements, and related methods and devices. For example, in some embodiments, a transistor arrangement may include a fin stack of one or more semiconductor materials shaped as a fin extending away from a base and a subfin dielectric stack. The fin includes a subfin portion and a channel portion, which portions may be made of one or more of the same or different semiconductor materials. As used herein, the term "channel material" refers to a semiconductor material, or multiple such materials, of the fin stack of which the channel portion of the fin is formed. The transistor arrangement may further include a subfin dielectric stack including a transistor dielectric material, e.g. STI, and a fixed charge liner material, different from the transistor dielectric material, disposed between the transistor dielectric material and the subfin portion of the fin.

The performance of a tri-gate transistor may depend on the number of factors. For example, ideally, conducting channels of a tri-gate transistor are only formed within the channel portion of the fin (i.e. the upper portion of a fin over which the gate electrode has control to turn the transistor either on or off, the portion wrapped around by the gate stack of the transistor). On the other hand, current in the subfin portion of the fin (i.e. the portion of the fin surrounded by the STI, the portion below the channel portion of the fin) is supposed to be blocked/suppressed. However, completely eliminating current in the subfin is difficult to achieve in practice. A term "subfin leakage" is commonly used to characterize the amount of or refer to current flowing in the subfin between the source and drain at the "off" state of the transistor. Subfin leakage is problematic because sufficiently large current in the subfin can result in a complete inability to turn off the tri-gate transistor, rendering such a transistor inoperable. Thus, the efficiency at which a tri-gate transistor is able to operate (in particular, to turn off) depends on the amount of subfin leakage—the smaller the subfin leakage, the better the performance of a tri-gate transistor. Eliminating or at least minimizing/reducing subfin leakage current may be referred to as "subfin leakage suppression."

The performance of a tri-gate transistor may also depend on the amount of interface traps, defects at which charge carriers are trapped and released, present in the channel. Defects in the channel impede performance of a transistor because they trap charge carriers (electrons for an N-type channel or holes for a P-type channel) which are supposed to be mobile and contribute to channel current, thus decreasing mobile carrier density in the channel and channel conductivity. A transistor channel with a higher conductivity enables a higher drive current in response to a given electric field than a channel with a lower conductivity; thus, higher channel conductivity may be associated with improved performance.

Several approaches have been explored in the past in an attempt to provide adequate subfin leakage suppression.

One such approach is based on using conduction band offset (CBO) or valence band offset (VBO) for, respectively, N-type and P-type channels. Such an approach includes implementing one semiconductor material in the subfin and a different semiconductor (in particular, a semiconductor with a different band gap) in the channel portion of a fin in order to create an energy band offset, i.e. a heterojunction, intended to prevent mobile charge carriers of the channel portion to get into the subfin portion. One problem with this approach is that aligning the different semiconductor materials of the subfin portion and the channel portion exactly where the gate stack ends (i.e. where the channel portion should end) and the STI begins is difficult. Unless perfect alignment is achieved, mobile charge carriers can form either inside the channel material below the gate contributing to subfin leakage or inside the subfin material portion within the gate contributing to additional capacitance with low conductivity due to low carrier mobility of the subfin material. Another problem is that defects, such as misfit dislocations and threading dislocations are introduced at and away from an interface between such materials, due to the lattice mismatch of these different crystalline materials. While the misfit dislocations may be originated at the very bottom of the channel, where the channel aligns with the subfin, these defects may propagate (or thread) further into the channel as threading dislocations introducing electronic states in the bandgap and act as bulk traps, decreasing channel conductivity. Yet another problem is that not all semiconductor material which could, potentially, be used as suitable channel materials are suitable for implementing this approach, limiting the range of channel materials used.

Another known approach to combating subfin leakage is based on using either different or the same semiconductor material in the subfin compared to the channel portions of a fin, but doping the material of the subfin to prevent conduction in the subfin between the source and drain. For example, an intrinsic, undoped Si can be used as a channel material and could be doped in the subfin to become a p-doped Si for a NMOS device so that mobile electrons from the source and drain (i.e. the charge carriers used in an N-type channel) cannot conduct through the subfin, thus suppressing subfin leakage. In another example, an intrinsic, undoped Ge can be used as a channel material and an intrinsic, undoped Si can be used as a subfin material to form a heterojunction with a large valance band offset (VBO) to suppress the subfin leakage (mobile holes) in a PMOS device according to the first approach described above. However, this does not apply to a NMOS device because the CBO at the heterojunction is too small to prevent mobile electrons from flowing into the subfin from the source and drain of the NMOS device. Thus, a p-doped Si is used as a subfin material for an N-type Ge channel. One problem with this approach relates to difficulties in achieving sufficient doping concentrations needed for effective subfin leakage suppression. Another problem is that doping requires a subsequent anneal step to activate the dopants, but high temperatures used for the anneal make the junction between the undoped material of the channel and the doped material of the subfin less sharp, i.e. some of the dopants may diffuse from the subfin into the channel, degrading mobility in the channel. Yet another problem with this approach is similar to the problem of the first approach in that not all potential channel materials could be easily used for this approach, thus limiting the range of channel materials which could be implemented.

Embodiments disclosed herein present a new approach to suppressing subfin leakage in tri-gate transistors. The proposed approach is based on providing a layer of a fixed charge dielectric material, referred to herein as a "fixed charge liner material" and comprising either positive or negative fixed charges, at an interface between a subfin and a conventional transistor dielectric material for fin-to-fin isolation such as e.g. STI. In some embodiments, a layer of the fixed charge liner material may directly border the semiconductor material of choice in the subfin portion of the fin, and may be sandwiched between the semiconductor material of the subfin and the transistor dielectric material. The transistor dielectric material and the fixed charge liner material together refer to herein as a "subfin dielectric stack." In contrast to accidental and typically undesirable fixed charges which may sometimes be present in semiconductor devices, the fixed charge liner material proposed herein is a material that contains deliberately created fixed charges in concentrations which are higher than concentrations of whichever unintentional fixed charges may be present in e.g. the conventional transistor dielectric material enclosing the subfin portion.

The use of a fixed charge liner at the interface between the subfin and the STI may achieve one or more of a number of advantages.

When a fixed charge liner material having negative fixed charges is provided around a subfin portion of an N-type channel material of a fin (i.e. when the transistor is an N-type channel transistor because its channel relies on electrons as the charge carriers for conduction), mobile electrons which may be present in the subfin portion from the $N^+$ source and drain are repelled from the negative fixed charges, due to the Coulomb forces, resulting in depletion of mobile electrons in the subfin. When a fixed charge dielectric material having positive fixed charges is provided around a subfin portion of a P-type channel material of a fin (i.e. when the transistor is a P-type channel transistor because its channel relies on holes as the charge carriers for conduction), mobile holes which may be present in the subfin portion from the $P^+$ source and drain are repelled from the positive fixed charges, again due to the Coulomb forces, resulting in depletion of mobile holes in the subfin. Because the fixed charge liner material provided in this manner depletes mobile carriers in the subfin or/and blocks entrance of mobile carriers into the subfin from the channel, there are less, if any, mobile carriers present in the subfin that could contribute to current, resulting in reduction or complete elimination of subfin leakage. Thus, the fixed charge liner material as proposed herein can effectively suppress (i.e. reduce or eliminate) subfin leakage.

In addition to subfin leakage suppression, the use of a fixed charge liner at an interface between a subfin and STI allows realizing higher conductivity in the channel because heterojunctions and doped subfin regions used in conventional approaches to subfin leakage suppression described above no longer need to be carefully aligned with the gate stack. In fact, such heterojunctions and doped subfin regions do not need to be implemented if the fixed charge liner as described herein is implemented because the fixed charge liner already suppresses subfin leakage suppression. However, if still used as secondary means for subfin leakage suppression or other purposes such as buffer layers between the substrate material and semiconductor material(s) of the fin, the heterojunctions can be moved further down into the subfin, away from the channel, thus minimizing the amount of defects that may travel up to the channel and degrade conductivity. Similarly, if at all used, doped regions in the subfin used to address subfin leakage could be made smaller, thus minimizing the drawbacks associated with them, described above.

Yet another advantage of the proposed approach is that the tri-gate transistor subfin arrangements disclosed herein enable the use of a wider array of transistor channel materials, while achieving desirable gate control, than realizable using conventional approaches.

Tri-gate transistor arrangements with subfin dielectric stacks described herein may be implemented in one or more components associated with an integrated circuit (IC) or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well-known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art. For example, as used herein, a "high-k dielectric" refers to a material having a higher dielectric constant than silicon oxide. The terms "substantially," "close," "approximately," "near," and "about," generally refer to being within +1-20% of a target value based on the context of a particular value as described herein or as known in the art. The terms "oxide," "carbide," "nitride," etc. refer to compounds containing, respectively, oxygen, carbon, nitrogen, etc.

FIG. 1 is a perspective view of an example arrangement 100 with a tri-gate transistor 101 having a fixed charge liner 130, in accordance with various embodiments. Note that the arrangement 100 shown in FIG. 1 is intended to show relative arrangements of some of the components therein, and that the arrangement 100, or portions thereof, may include other components that are not illustrated (e.g., electrical contacts to the source and the drain of the transistor 101, additional layers such as e.g. a spacer layer, around the gate electrode of the transistor 101, etc.).

As shown, the tri-gate transistor 101 of FIG. 1 may include a base 102, a transistor dielectric material 104, and a gate stack 106 comprising a gate electrode material 108 (which could include a stack of one or more gate electrode materials) and a gate dielectric 110 (which could include a stack of one or more gate dielectric materials). In the tri-gate transistor 101 illustrated in FIG. 1, a fin 112 formed of one or more semiconductor materials 114 may extend from the base 102 of the semiconductor material.

In general, implementations of the present disclosure may be formed or carried out on a substrate, such as a semiconductor substrate composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which a semiconductor device may be built falls within the spirit and scope of the present disclosure. In various embodiments the base 102 may include any such substrate that provides a suitable surface for providing the arrangement 100.

The transistor dielectric material 104 forms an STI enclosing the sides of the fin 112. A portion of the fin 112 enclosed by the STI 104 forms a subfin 116. The STI material 104 may be a low-k or high-k dielectric including but not limited to elements such as hafnium, silicon, oxygen, nitrogen, titanium, tantalum, lanthanum, aluminum, zirconium, barium, strontium, yttrium, lead, scandium, niobium, and zinc. Further examples of dielectric materials that may be used in the STI material 104 may include, but are not limited to silicon nitride, silicon oxide, silicon dioxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate.

In the arrangement 100, the fixed charge liner material 130 is provided between the transistor dielectric material 104 and the subfin 116. The fixed charge liner 130 is provided as a layer of a fixed charge material, described in greater detail below, enclosing the sides of the subfin 116 and the STI 104 encloses the fixed charge liner 130. The fixed charge liner 130 may have a thickness, a dimension measured in the direction of the y-axis of the reference coordinate system x-y-z shown in FIG. 1, that may, in some embodiments, be between 2 nanometers and 20 nanometers, including all values and ranges therein (e.g., between 5 and 15 nanometers, or between 7 and 10 nanometers). In some embodiments, the fixed charge liner 130 may be in contact with the subfin 116 and/or with the STI 104. In other embodiments, one or more thin interfacial layers may be provided in between (not shown in FIGS). Together, the transistor dielectric material 104 and the fixed charge liner material 130 form a subfin dielectric stack 105.

Above the subfin dielectric stack 105, the gate stack 106 may wrap around the fin 112 as shown, with a channel portion 118 corresponding to the portion of the fin stack 114 of the fin 112 wrapped by the gate stack 106. In particular, the gate dielectric 110 may wrap around the fin stack 114 of the fin 112, and the gate electrode material 108 may wrap around the gate dielectric 110. The horizontal dashed line shown in FIG. 1 on the front end face of the fin 112 is intended to illustrate the division between the channel portion 118 and the subfin 116, i.e. the interface between the channel portion 118 and the subfin portion 116 is located proximate to where the gate electrode 108 ends, which is typically where the STI 104 begins.

The gate electrode material 108 may include at least one P-type work function metal or N-type work function metal, depending on whether the transistor 101 is a P-type metal oxide semiconductor (PMOS) transistor or an N-type metal oxide semiconductor (NMOS) transistor (P-type work function metal used as the gate electrode 108 when the transistor 101 is a PMOS transistor and N-type work function metal used as the gate electrode 108 when the transistor 101 is an NMOS transistor). For a PMOS transistor, metals that may be used for the gate electrode material 108 may include, but are not limited to, ruthenium, palladium, platinum, cobalt, nickel, and conductive metal oxides (e.g., ruthenium oxide). For an NMOS transistor, metals that may be used for the gate electrode material 108 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode material 108 may consist of a stack of two or more metal layers, where one or more metal layers are work function metal layers and at least one metal layer is a fill metal layer. Further layers may be included next to the gate electrode material 108 for other purposes, such as to act as a diffusion barrier layer or/and an adhesion layer.

In some embodiments, the gate dielectric 110 may include one or more high-k dielectrics including any of the materials discussed herein with reference to the STI material 104. In some embodiments, an annealing process may be carried out on the gate dielectric 110 during manufacture of the transistor 100 to improve the quality of the gate dielectric 110. The gate dielectric 110 may have a thickness, a dimension measured in the direction of the y-axis of the reference coordinate system x-y-z shown in FIG. 1, that may, in some embodiments, be between 0.5 nanometers and 3 nanometers, including all values and ranges therein (e.g., between 1 and 3 nanometers, or between 1 and 2 nanometers). In some embodiments, the gate stack 106 may be surrounded by a gate spacer, not shown in FIG. 1. The gate spacer is configured to provide separation between the gate stacks 106 of different transistors and typically is made of a low-k dielectric material (i.e. a dielectric material that has a lower dielectric constant (k) than silicon dioxide).

The fin stack 114 may be composed of semiconductor material systems including, for example, N-type or P-type materials systems. In some embodiments, the fin stack 114 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. The fin stack 114 may include a combination of semiconductor materials where one semiconductor material is used for the channel portion 118 and another material, sometimes referred to as a "blocking material," is used for at least a portion of the subfin 116. In some embodiments, the subfin 116 and the channel portion 118 are each formed of monocrystalline semiconductors. In a first embodiment, the subfin 116 and the channel portion 118 are each formed of compound semiconductors with a first sub-lattice of at least one element from group III of the periodic table (e.g., Al, Ga, In), and a second sub-lattice of at least one element of group V of the periodic table (e.g., P, As, Sb). The subfin 116 may be a binary, ternary, or quaternary III-V compound semiconductor that is an alloy of two, three, or even four elements from groups III and V of the periodic table, including boron, aluminum, indium, gallium, nitrogen, arsenic, phosphorus, antimony, and bismuth. For exemplary N-type transistor embodiments, the channel portion 118 is advantageously a III-V material having a high electron mobility, such as, but not limited to InGaAs, InP, InSb, and InAs. For some such embodiments, the channel portion 118 is a ternary III-V alloy, such as InGaAs, GaAsSb, InAsP, or InPSb. For some $In_xGa_{1-x}As$ fin embodiments, In content (x) is between 0.6 and 0.9, and advantageously is at least 0.7 (e.g., $In_{0.7}Ga_{0.3}As$). In some embodiments with highest mobility, the channel portion 118 is intrinsic III-V material and not intentionally doped with any electrically active impurity. In alternate embodiments, a nominal impurity dopant level may be present within the channel portion 118, for example to set a threshold voltage Vt, or to provide HALO pocket implants, etc. Even for impurity-doped embodiments however, impurity dopant level within the channel portion 118 is relatively low, for example below $10^{15}$ $cm^{-3}$, and advantageously below $10^{13}$ $cm^{-3}$. The subfin 116 may be a III-V material having a band offset (e.g., conduction band offset for N-type devices) from the channel portion 118. Exemplary materials, include, but are not limited to, GaAs, GaSb, GaAsSb, GaP, InAlAs, GaAsSb, AlAs, AlP, AlSb, and AlGaAs. In some N-type transistor embodiments where the channel portion 118 is InGaAs, the subfin 116 is GaAs, and at least a portion of the subfin 116 may also be doped with impurities (e.g., p-type) to a greater impurity level than the channel portion 118. In an alternate heterojunction embodiment, the subfin 116 and the channel portion 118 are each group IV semiconductors (e.g., Si, Ge, SiGe). The subfin 116 may be a first elemental semiconductor (e.g., Si or Ge) or a first SiGe alloy (e.g., having a wide bandgap). For exemplary P-type transistor embodiments, the channel portion 118 is advantageously a group IV material having a high hole mobility, such as, but not limited to Ge or a Ge-rich SiGe alloy. For some exemplary embodiments, the channel portion 118 has a Ge content between 0.6 and 0.9, and advantageously is at least 0.7. In some embodiments with highest mobility, the channel portion 118 is intrinsic III-V (or IV for P-type devices) material and not intentionally doped with any electrically active impurity. In alternate embodiments, one or more a nominal impurity dopant level may be present within the channel portion 118, for example to set a threshold voltage Vt, or to provide HALO pocket implants, etc. Even for impurity-doped embodiments however, impurity dopant level within the channel portion 118 is relatively low, for example below $10^{15}$ cm$^{-3}$, and advantageously below $10^{13}$ cm$^{-3}$. The subfin 116 may be a group IV material having a band offset (e.g., valance band offset for P-type devices) from the channel portion 118. Exemplary materials, include, but are not limited to, Si or Si-rich SiGe. In some P-type transistor embodiments, the subfin 116 is Si and at least a portion of the subfin 116 may also be doped with impurities (e.g., n-type) to a higher impurity level than the channel portion 118.

The fin 112 may include a source region 120 and a drain region 122 on either side of the gate stack 106, as shown, thus realizing a transistor. As is well known in the art, source and drain regions are formed for the gate stack of each MOS transistor. The source and drain regions may generally be formed using either an implantation/diffusion process or an etching/deposition process. In the former process, dopants such as boron, aluminum, antimony, phosphorous, or arsenic may be ion-implanted into the fin stack material(s) 114 to form the source and drain regions. An annealing process that activates the dopants and causes them to diffuse further into the fin stack 114 typically follows the ion implantation process. In the latter process, the fin stack 114 may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. Although not specifically shown in the perspective illustration of FIG. 1, in further embodiments, one or more layers of metal and/or metal alloys are typically used to form the source and drain contacts.

The transistor 101 may have a gate length (i.e. a distance between the source region 120 and the drain region 122 of the transistor 101), a dimension measured along the fin 112, in the direction of the x-axis of an exemplary reference coordinate system x-y-z shown in FIG. 1, which may, in some embodiments, be between 20 and 40 nanometers, including all values and ranges therein (e.g. between 22 and 35 nanometers, or between 20 and 30 nanometers). The fin 112 may have a thickness, a dimension measured in the direction of the y-axis of the reference coordinate system x-y-z shown in FIG. 1, that may, in some embodiments, be between 5 and 30 nanometers, including all values and ranges therein (e.g. between 7 and 20 nanometers, or between 10 and 15 nanometers). The fin 112 may have a height, a dimension measured in the direction of the z-axis of the reference coordinate system x-y-z shown in FIG. 1, which may, in some embodiments, be between 30 and 350 nanometers, including all values and ranges therein (e.g. between 30 and 200 nanometers, between 75 and 250 nanometers, or between 150 and 300 nanometers).

Although the fin 112 illustrated in FIG. 1 is shown as having a rectangular cross section in a z-y plane of the reference coordinate system shown in FIG. 1, the fin 112 may instead have a cross section that is rounded or sloped at the "top" of the fin 112, and the gate stack 106 may conform to this rounded or sloped fin 112. In use, the tri-gate transistor 101 may form conducting channels on three "sides" of the fin 112, potentially improving performance relative to single-gate transistors (which may form conducting channels on one "side" of a channel material or substrate) and double-gate transistors (which may form conducting channels on two "sides" of a channel material or substrate).

Turning back to the fixed charge liner 130, in general, a fixed charge material is a dielectric material that contains fixed charges (i.e. charges which are not mobile), which could be either positive or negative charges depending on a bandgap of a dielectric material and on how the dielectric material was formed/processed, with the concentration of the fixed charges in the fixed charge material being higher than that accounting for whichever unintentional fixed charges may be present in a typical dielectric of the same type of material. For example, the concentration of the fixed charges in the fixed charge dielectric material may be $10^{12}$, or higher, per square centimeter.

Conventionally, having fixed charges in a transistor has been something to avoid and to reduce (unintentional small amounts of fixed charges are often inevitable), by careful architecture design, choice of materials, and tight control of fabrication processes. In contrast to this conventional line of thinking, inventors of the present disclosure realized that deliberately adding fixed charge, to carefully and specifically selected locations in a transistor, may actually provide advantages. This realization is based on recognition that, in context of the transistor arrangement 100, if a dielectric material having a sufficient amount of fixed charges is provided in sufficiently close proximity to a part of the fin stack 114 where it is desirable to prevent flow of any currents, i.e. the subfin 116, then the fixed charges of the fixed charge dielectric material can interact with whichever spurious (i.e. unintentional) mobile charges may have been present in the subfin 116 by Coulomb forces and can deplete or block mobile charges in that part, thus effectively suppressing subfin leakage of the transistor 101.

Several considerations are important in providing a fixed charge liner 130 formed of a suitable fixed charge dielectric material.

One consideration is the proper choice of fixed charges to be provided in the dielectric material. In context of the transistor arrangement 100, fixed charges arise when there are unoccupied electron states of donor type in the fixed charge dielectric material which are higher in energy than a conduction band of the subfin 116 (such fixed charges are referred to as "positive fixed charges") or occupied electron states of acceptor type in the fixed charge dielectric material which are lower in energy than a valence band of the subfin 116 (such fixed charges are referred to as "negative fixed charges"). Whether the dielectric material is to implement positive or negative charges depends on whether the transistor 101 is an N-type or a P-type transistor, and on the bandgaps of the dielectric material and the subfin semiconductor material (the latter described in greater detail below with reference to FIG. 2).

For an N-type transistor 101, the fixed charge dielectric material of the fixed charge liner 130 should have sufficient concentration of negative fixed charges, e.g. greater than $10^{12}$ negative charges per square centimeter. Due to the Coulomb forces, the negative fixed charges of the fixed charge liner 130 will repel the mobile electrons (i.e. the charge carriers of the N-type channel transistor 101) in the area of the subfin 116 enclosed by the fixed charge liner 130. Eliminating/depleting mobile electrons in the subfin 116 means that no mobile electrons remain there to contribute to the leakage current. Similarly, for a P-type transistor 101, the fixed charge dielectric material of the fixed charge liner 130 should have sufficient concentration of positive fixed charges, e.g. greater than $10^{12}$ positive charges per square centimeter. Due to the Coulomb forces, the positive fixed charges of the fixed charge liner 130 will repel the mobile holes (i.e. the charge carriers of the P-type channel transistor 101), in the area of the subfin 116 enclosed by the fixed charge liner 130. Eliminating/depleting mobile holes in the subfin 116 means that no mobile holes remain there to contribute to current. Thus, in general, eliminating/depleting the mobile charge carriers in the subfin 116 means that no mobile carriers remain in that part of the fin 112 to contribute to current.

Figure 2:
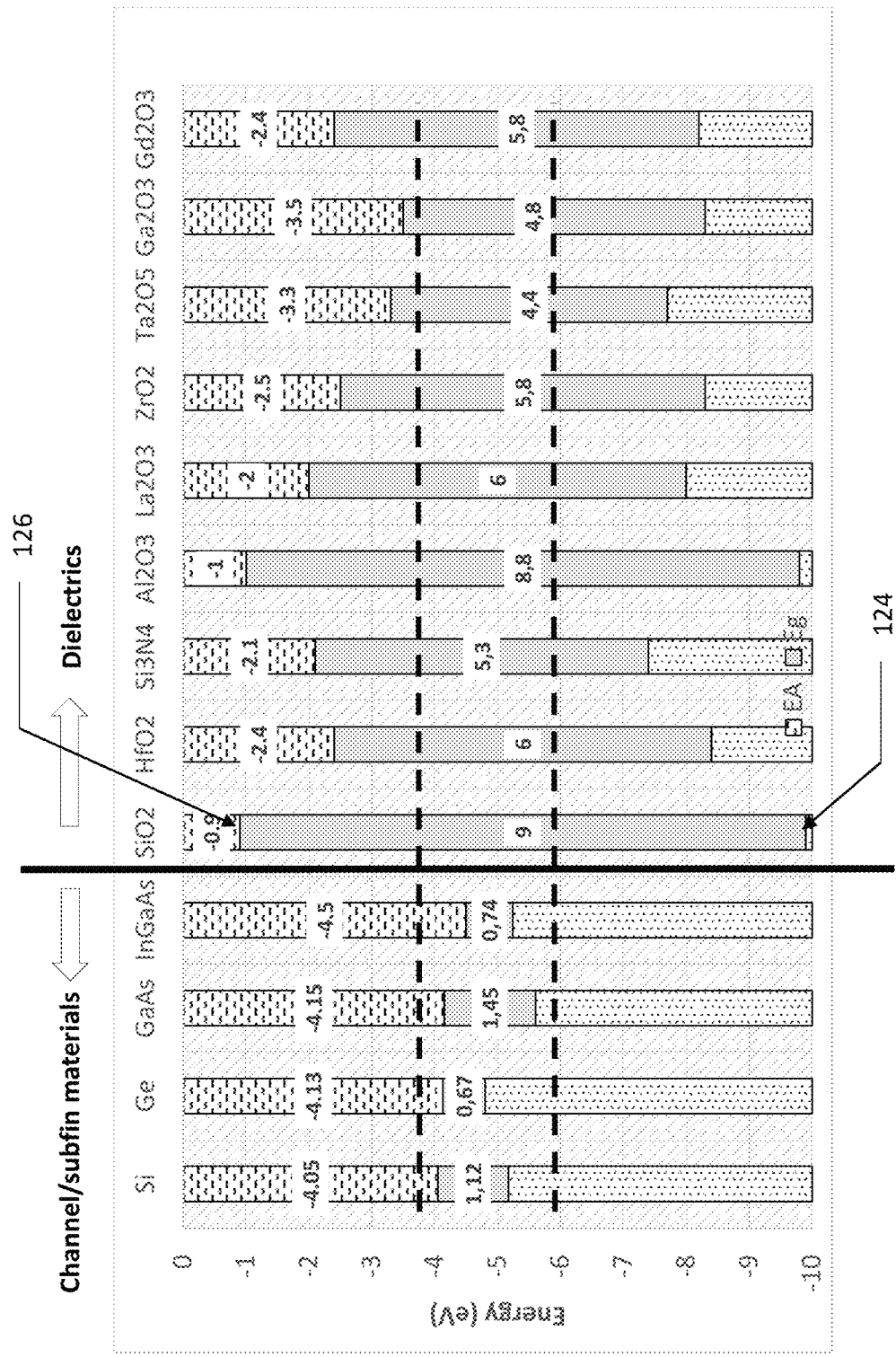
FIG. 2 is an illustration of bandgaps of several exemplary semiconductor materials for use in the fin stack of the transistors described herein and of several exemplary dielectric materials for use as the fixed charge liner described herein.

Another consideration that is important in providing a suitable fixed charge liner 130 is the proper selection and processing of the dielectric material to be used as the fixed charge liner 130. As described above, positive fixed charges can be created when there are unoccupied electron states of donor type in the fixed charge liner 130 which are higher in energy than the bottom conduction band of the subfin material 116 while negative fixed charges can be created when there are occupied electron states of acceptor type in the fixed charge liner 130 which are lower in energy than the top valence band of the subfin 116. FIG. 2 illustrates bandgaps of several exemplary semiconductor materials which could be used in the subfin 116 and several exemplary dielectric materials which could be used as the fixed charge liner 130. Because the channel portion 118 of the fin 112 may be made of the same material as the subfin, FIG. 2 refers to the semiconductor materials show on the left portion of the FIG. as "channel/subfin materials." A bandgap of each material shown in FIG. 2 is the energy difference (in electron volts, shown along the vertical axis of FIG. 2) between the top of the valence band 124 and the bottom of the conduction band 126, labeled in FIG. 2 only for silicon dioxide (SiO2) as an example.

As is shown in FIG. 2, some dielectric materials can be discounted right away from being used for creating fixed charges of a particular sign (either positive or negative) because their band offset from the respective subfin material is not sufficiently large. In this context, when evaluating a potential dielectric material for forming a positive fixed charge liner 130, the term "band offset" (more specifically, "conduction band offset") refers to the difference in energy values between the bottom of the conduction band of the potential dielectric material and the bottom of the conduction band of the subfin material. On the other hand, when evaluating a potential dielectric material for forming a negative fixed charge liner 130, the term "band offset" (more specifically, "valence band offset") refers to the difference in energy values between the top of the valence band of the sufin material and the top of the valence band of the potential dielectric material. For example, as can be seen in FIG. 2, the bandgap of gallium oxide (Ga2O3) is such that there are relatively few unoccupied electron states of donor type, as indicated by their bottom of the conduction band values 126, which are higher in energy than the bottom of the conduction bands of the channel/subfin materials shown in FIG. 2, i.e. the conduction band offset is relatively small, compared to other dielectrics shown in FIG. 2. Therefore, gallium oxide would not be the preferred dielectric material to form a positive fixed charge liner as described herein for use with a P-MOS channel transistor 101. Similarly, the bandgap of tantalum pentoxide (Ta2O5) is such that, compared to gallium oxide (Ga2O3), there are somewhat more unoccupied electron states of donor type which are higher in energy than the conduction bands of the subfin materials shown in FIG. 2, so tantalum pentoxide would make a better dielectric than gallium oxide to use with P-MOS transistors. However, compared to still other dielectrics shown in FIG. 2, even tantalum pentoxide has relatively few unoccupied electron states of donor type which are higher in energy than the bottom of the conduction bands of the subfin materials shown in FIG. 2.

All of the dielectric materials shown in FIG. 2 appear to be sufficiently suitable for implementing negative fixed charges for use in the fixed charge liner 130 provided in the transistor 101 having an N-type channel (i.e. all of the dielectric materials shown in FIG. 2 appear to have adequate numbers of occupied electron states of acceptor type, as indicated by their top of the valence band values 124, which are lower in energy than valence bands of potential subfin materials shown in FIG. 2; in other words, all of the dielectric materials shown in FIG. 2 appear to have sufficiently large valence band offsets compared to typical subfin materials).

Some of the dielectric materials shown in FIG. 2 appear to be suitable for implementing both positive fixed charges and negative fixed charges for use in the fixed charge liner 130, such as e.g. silicon dioxide (SiO2) which could have both unoccupied electron states of donor type (as indicated by its bottom of the conduction band 126 being sufficiently far, in terms of eV, from the conduction band of potential subfin materials shown in FIG. 2) for forming positive fixed charges as well as occupied electron states of acceptor type (as indicated by its top of the valence band 124 being sufficiently far, in terms of eV, from the valence band of potential subfin materials shown in FIG. 2) for forming negative fixed charges. Whether such a material will have positive or negative fixed charges depends on how the material is processed/fabricated, as described in greater detail below. In other words, a given dielectric material (i.e. a material having a certain valence and conduction band values), may be processed to deliberately have a certain concentration of positive charges or a certain concentration of negative charges. A given dielectric material could also be processed to minimize/reduce the amount of fixed charges. For example, other dielectric materials used in transistor devices, e.g. the dielectric material used as the STI 104 or the dielectric material used as the gate dielectric 110, are typically processed to minimize the amount of fixed charges and, therefore, may have only some unintentional fixed charges still present therein, in concentrations far below the concentration of fixed charges that is intentionally provided in the fixed charge liner 130 according to embodiments of the present disclosure.

Yet another consideration that is important in providing a suitable fixed charge liner 130 is the amount of fixed charges provided within the liner. The more fixed charges are in the fixed charge liner 130, the higher level of mobile carrier depletion can be achieved in the part of the fin stack enclosed by the fixed charge liner 130 (i.e. the subfin 116). One factor that affects the amount of fixed charges in a dielectric material is the concentration of fixed charges in the material—the higher the concentration, the more fixed charges can be present in a given area/volume. Another factor is the area/volume of the fixed charge liner 130 that is in sufficient proximity to the subfin 116 to deplete mobile carriers there due to Coulomb interactions. In that respect, a thickness of the fixed charge liner 130, a dimension measured in the direction of the y-axis of the reference coordinate system x-y-z shown in FIG. 1, becomes important. In some embodiments, the thickness of the fixed charge liner 130 may be between 2 nanometers and 20 nanometers, including all values and ranges therein (e.g., between 5 and 15 nanometers, or between 7 and 10 nanometers). The greater this thickness, the higher levels of depletion can be achieved. In general, the greater the surface area of the fixed charge material that is in contact with the subfin 116, the greater depletion of the mobile carriers in the subfin 116 enclosed by the surface can be achieved. A person of ordinary skill in the art would recognize further similar considerations in appropriate selection of the fixed charge liner material, all of which being within the scope of the present disclosure.

FIGS. 3-6 are cross-sectional views of the arrangement 100 shown in FIG. 1, in accordance with various embodiments. In particular, each of FIGS. 3-6 illustrates a cross-section of the arrangement 100 taken along the section A-A of FIG. 1 (i.e. the y-z plane of the reference coordinate system shown in FIG. 1). A number of elements labeled in FIG. 1 with reference numerals are indicated in FIGS. 3-6 with different patterns, with a legend showing the correspondence between the reference numerals and patterns being provided at the bottom of FIGS. 3-6. In particular, the legend illustrates that FIGS. 3-6 use different patterns to show the base 102, the transistor dielectric 104, the gate electrode material 108, the gate dielectric 110, and the fixed charge liner 130 as shown in FIG. 1. The legend further illustrates that FIGS. 3-6 use different patterns to show a semiconductor material 132 used, in some embodiments, to form the entire fin stack 114 described herein (i.e. both the subfin 116 and the channel portion 118 of the fin 112). In addition, the legend illustrates that FIGS. 3-6 use different patterns to show materials 134 and 136, which are two different semiconductor materials which may be used to form a heterojunction in the fin stack 114. Finally, the legend illustrates a pattern used in FIGS. 3-6 to show defects due to the presence of a heterojunction in the fin stack.

FIGS. 3-6 are intended to provide an illustration of some further details of the arrangement 100, thus all of the descriptions provided above with respect to reference numerals indicated in FIG. 1 are applicable to FIGS. 3-6 and are not repeated.

Each of FIGS. 3-6 illustrates that the fixed charge liner 130 may line the lower portion of the fin 112, namely, line the subfin portion 116, thus provided between the transistor dielectric 104 and the material of the subfin 116. The transistor dielectric 104 and the fixed charge liner 130 form the subfin dielectric stack 105 labeled in each of FIGS. 3-6.

Furthermore, each of FIGS. 3-6 also illustrates the gate stack 106 wrapping around the channel portion 118 of the fin 112. Namely, each of FIGS. 3-6 illustrates the gate dielectric 110 wrapping around the channel portion 118 and the gate electrode material 108 wrapping around the gate dielectric 110.

FIGS. 3 and 5 illustrate examples when the transistor 101 is an N-type transistor, while FIGS. 4 and 6 illustrate examples when the transistor 101 is a P-type transistor. In particular, when the transistor 101 is an N-type transistor, then the fixed charge liner 130 should be a negative fixed charge material (as illustrated in FIGS. 3 and 5 with "−" signs within the fixed charge liner 130 lining the subfin 116). Such a negative fixed charge liner 130 can deplete the subfin portion 116 of spurious mobile electrons (i.e. the mobile charge carriers in an N-type transistor) which may be present in the subfin portion 116 instead of being constrained to the channel portion 118 only, leaving holes behind in the subfin 116 (as illustrated in FIGS. 3 and 5 with "+" signs within the subfin portion 116 along the interface with the fixed charge liner 130), eliminating, or at least reducing, possibilities for current conduction in the subfin 116. Similarly, when the transistor 101 is a P-type transistor, then the fixed charge liner 130 should be a positive fixed charge material (as illustrated in FIGS. 4 and 6 with "+" signs within the fixed charge liner 130 lining the subfin 116). Such a positive fixed charge liner 130 can deplete the subfin portion 116 of spurious mobile holes (i.e. the mobile charge carriers in a P-type transistor) which may be present in the subfin portion 116 instead of being constrained to the channel portion 118 only, leaving electrons behind in the subfin 116 (as illustrated in FIGS. 4 and 6 with "−" signs within the subfin portion 116 along the interface with the fixed charge liner 130), eliminating, or at least reducing, possibilities for current conduction in the subfin 116.

FIGS. 3 and 4 illustrate examples when the same material 132 is used to implement the entire fin stack, i.e. both the channel 118 and the subfin 116 portion of the fin. On the other hand, FIGS. 5 and 6 illustrate that the heterojunction approach to minimize subfin leakage can still be used, in combination with the fixed charge liner 130. In such implementations, two different crystalline semiconductor materials would be used, shown in FIGS. 5 and 6 as materials 134 and 136, which would form a suitable heterojunction aimed to reduce subfin leakage, as known in the art. However, in contrast to prior art implementations where the interface of such two different materials had to be aligned with the end of the gate stack 106 and the beginning of the STI 104, now the heterojunction may be moved further down into the subfin 116, as shown with two exemplary illustrations shown in FIGS. 5 and 6. Moving the heterojunction further down in the subfin 116 results that defects 138 are formed further away from the channel 118 and will have less of a negative effect on channel mobility.

Figure 7:
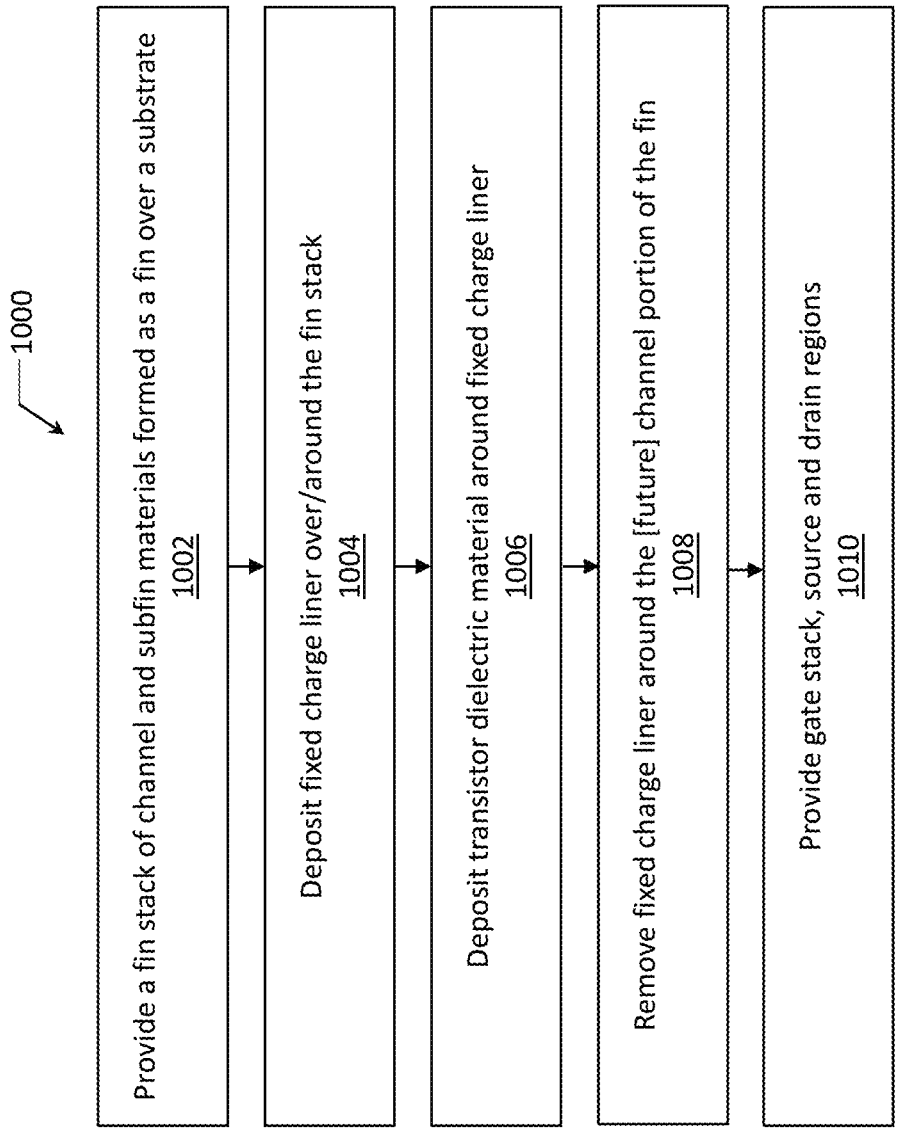
FIG. 7 is a flow diagram of an example method of manufacturing a tri-gate transistor with a fixed charge liner to suppress subfin leakage, in accordance with various embodiments.

The arrangement 100 disclosed herein may be manufactured using any suitable techniques. FIG. 7 is a flow diagram summarizing one example method 1000 of manufacturing the transistor arrangement 100, in accordance with various embodiments. FIGS. 8-11 illustrate various example stages in the manufacturing process summarized in FIG. 7, in accordance with various embodiments. While FIGS. 8-11 are illustrated for the example of manufacturing the arrangement 100 as depicted in FIG. 3 (i.e. an N-type transistor with a single semiconductor material 132 used for both the channel and the subfin regions of the fin), discussions provided herein with respect to manufacturing the transistor arrangement 100 may be easily extended/modified to be applicable to all other transistor arrangement embodiments discussed herein. For the sake of consistency, the legend and patterns used in FIGS. 8-11 are the same as the legend and patterns used in FIGS. 3-6.

Since FIGS. 8-11 are intended to provide an illustration of an example of manufacturing of the arrangement 100, in particular the arrangement as shown in FIG. 3, all of the descriptions provided above with respect to reference numerals indicated in FIGS. 1 and 3 are applicable to FIGS. 8-11 and are not repeated. On the other hand, although the particular manufacturing operations discussed below with reference to FIG. 7 are illustrated in FIGS. 8-11 as manufacturing particular embodiments of the arrangement as shown in FIG. 3, these operations may be applied to manufacture many different embodiments of the arrangement 100 as discussed herein. Any of the elements discussed below with reference to FIGS. 7-11 may take the form of any of the embodiments of those elements discussed above (or otherwise disclosed herein).

At 1002 shown in FIG. 7, a fin stack 114 (which may, but does not have to, include one material in the channel portion 118 and another, blocking, material in at least a portion of the subfin 116), formed as a fin, is provided over a substrate. The fin stack provided at 1002 may take the form of any of the embodiments of the fin stack 114 disclosed herein. The fin stack 114, shaped as the fin 112, may be provided at 1002 using any suitable deposition and patterning techniques known in the art. For example, in various embodiments, a conventional subtractive technique may be employed in which a blanket III-V film stack is grown over, or transferred to, a working surface of a substrate. That blanket III-V film stack is then etched into fin cores. In alternative embodiments, a buffer of semiconductor material is first formed following any known techniques. In some embodiments, numerous islands of III-V or group IV material may be grown over a silicon substrate having a plurality of seeding surface regions. In some such embodiments, seeding surface regions may be surrounded by high aspect ratio sidewalls to practice aspect ratio trapping (ART) and achieve acceptable crystal quality in a heteroepitaxial buffer material. The ART technique is one example of local additive heteroepitaxial buffer fabrication, which may advantageously reduce the effects of lattice mismatch across various substrate/buffer heterojunctions. With ART, defects on {111} planes should terminate on STI sidewalls, lowering defect count in channel material on top.

FIG. 8 illustrates a cross-sectional view of an assembly 202 including a base 102 and a fin stack 114 provided thereon, as a result of the process 1002 shown in the method 1000 of FIG. 8. The channel portion 118 and in the subfin 116 are not yet shown in FIG. 8 because which portion is the channel and which portion is the subfin of the fin 112 will be decided by the placement of the gate electrode stack, which happens later in the process. Although not shown in the assembly 202, providing the fin stack 114 may also involve patterning of the fin stack material to form the fin 112.

At 1004 shown in FIG. 7, a fixed charge liner is provided over the fin stack. The fixed charge liner provided at 1004 may take the form of any of the embodiments of the fixed charge dielectric liner disclosed herein (e.g. any of the embodiments discussed herein with reference to the fixed charge liner 130). A positive fixed charge liner disposed at 1004 may be provided according to the method 2000 shown in FIG. 12, while a negative fixed charge liner disposed at 1004 may be provided according to the method 3000 shown in FIG. 13, both methods described below.

FIG. 9 illustrates a cross-sectional view of an assembly 204 including the fixed charge dielectric liner 130 provided over the fin stack of the assembly 202, as a result of process 1004 shown in the method 1000 of FIG. 7.

At 1006 shown in FIG. 7, a transistor dielectric material is provided over the fixed charge liner. The transistor dielectric provided at 1006 may take the form of any of the embodiments of the transistor dielectric disclosed herein (e.g. any of the embodiments discussed herein with reference to the transistor dielectric 104) and may be provided at 1006 using any suitable deposition and patterning techniques known in the art.

FIG. 10 illustrates a cross-sectional view of an assembly 206 showing the transistor dielectric 104 provided over the fixed charge liner 130, as a result of process 1006 shown in the method 1000 of FIG. 7.

At 1008 shown in FIG. 7, the fixed charge liner is removed around the future channel portion 118 of the fin. Removing the fixed charge liner implies that the transistor dielectric is also removed around the channel portion. FIG. 11 illustrates a cross-sectional view of an assembly 208 showing both the transistor dielectric 104 and the fixed charge liner 130 removed from the channel 118 of the fin, as a result of process 1008 shown in the method 1000 of FIG. 7. The fixed charge liner and the transistor dielectric may be removed using any suitable techniques known in the art.

At 1010 shown in FIG. 7, a gate stack is provided over the channel portion 118, i.e. where the fixed charge liner and the transistor dielectric are removed. The gate stack provided at 1010 may take the form of any of the embodiments of the tri-gate gate stack 106 disclosed herein and may be provided at 1010 using any suitable deposition and patterning techniques known in the art. FIG. 3 described above illustrates the cross-sectional view of an assembly having the gate stack 106 provided thereon, as a result of process 1010 shown in the method 1000 of FIG. 7.

Many variations are possible to the method 1000 shown in FIGS. 7-11, all of which being within the scope of the present disclosure. For example, the fixed charge liner may be provided not over the entire fin stack as shown in FIG. 9, but only over the future subfin portion 116, or it could be removed from the channel portion 118 prior to the deposition of the transistor dielectric material around it. In another example, the transistor dielectric may be provided around the entire assembly with the fixed charge liner 130, and subsequently the fixed charge liner and the transistor dielectric are removed from the channel portion 118 simultaneously. In yet another example, if ART technique was used to form the tri-gate transistor, then the order and nature of steps for including in such a transistor the fixed charge dielectric layer as described herein may also change. Furthermore, the method 1000 shown in FIG. 7 may further include other manufacturing operations related to fabrication of other components of the arrangement 100, or any devices that include such arrangements. For example, the method 1000 may various cleaning operations, surface planarization operations (e.g. using chemical mechanical polishing), operations to include barrier and/or adhesion layers as needed, and/or operations for incorporating the arrangement 100 in, or with, an IC component.

FIG. 12 is a flow diagram of an example method 2000 of providing a positive fixed charge dielectric liner, in accordance with various embodiments. The method 2000 may be used to form a positive fixed charge dielectric material that can be used as the fixed charge liner 130 described herein.

As described above, positive fixed charges can be created in a dielectric material having sufficiently large conduction band offset with respect to a subfin material used (i.e. so that there is a sufficient number of unoccupied electron states of donor type in the fixed charge liner 130 which are higher in energy than the bottom conduction band of the subfin 116). Therefore, the method 2000 may begin at 2002, with selecting a dielectric material having a sufficiently large conduction band offset from that of the semiconductor material selected as the material for the subfin 116. In some embodiments, any dielectric material having a conduction band offset greater than 1 eV may be selected. In some embodiments, the dielectric material selected at 2002 has a conduction band offset greater than 2 eV, e.g. greater than 3 eV or greater than 4 eV. Sufficient conduction band offset between the selected dielectric and subfin materials ensures that, by applying the growth processing of the selected dielectric material as described below, positive fixed charge can be incorporated into the dielectric material. Dielectric materials that could be used for forming positive fixed charge dielectric materials include, but are not limited to oxides (ex. beryllium oxide, magnesium oxide, aluminum oxide, hafnium oxide, zirconium oxide, lanthanum oxide, yttrium oxide, scandium oxide, gadolinium oxide, etc.), nitrides (ex. boron nitride, aluminum nitride, silicon nitride, etc.), carbides (wide-band-gap polytypes of silicon carbide, ex. 2H and 4H, etc.), and silicates (ex. hafnium silicate, zirconium silicate, etc.).

At 2004, the method 2000 may proceed with the deposition of the selected dielectric material, e.g. using CDV or ALD, under deposition conditions that promote incorporation of positive fixed charges in the dielectric material being grown.

In general, CVD or ALD is a chemical process in which one or more reactive precursor gases are introduced into a reaction chamber and directed towards a substrate in order to induce controlled chemical reactions that result in growth of a desired material on the substrate. The one or more reactive gases may be provided to the chamber at a flow rate of e.g. 5 standard cubic centimeter per minute (sccm) to 500 sccm, including all values and ranges therein. The reactive gas may be provided with a carrier gas, such as an inert gas, which may include, for example, argon. In some embodiments, the chamber may be maintained at a pressure in the range of 1 milliTorr to 100 milliTorr, including all values and ranges therein, and a temperature in the range of 100° C. to 500° C., including all values and ranges therein. The substrate itself may also be heated. In some embodiments, the process may be plasma assisted where electrodes are provided within the process chamber and are used to ionize the gases. Alternatively, plasma may be formed outside of the chamber and then supplied into the chamber. In the chamber, a layer of solid thin film material is deposited on the surface of the substrate due to reaction of the gas/gasses.

In process 2004, the substrate placed in the CVD or ALD reaction chamber may be e.g. the assembly 202 shown in FIG. 8 (i.e. an assembly of a substrate with a fin stack formed as a fin). The layer of solid thin film material deposited on the surface of such a substrate due to reaction of precursor gasses in the reaction chamber is the layer of the positive fixed charge dielectric material as described herein. A selection of particular one or more precursor gases used in process 2004 would depend on the dielectric material selected in process 2002. Deposition conditions that promote incorporation of positive fixed charges, e.g. in the form of native point defects or/and impurities, may include providing cation-rich environment in the reaction chamber, doping of the dielectric material being grown with positively charged impurity atoms, and adding negatively charged hydrogen atoms to the reaction chamber (i.e. providing hydrogen ambient growth).

In some embodiments, providing cation-rich growth conditions may include ensuring that the partial pressure of cation-precursor species in the reaction chamber is at or above a certain threshold, the threshold being provided either as an absolute value or a value relative to partial pressure of other gasses in the chamber, e.g. of the anion-precursor gases. In some embodiments, establishing cation-rich growth conditions may include ensuring that the partial pressure of the cation precursor gas/gases is greater than the partial pressure of the anion precursor gases. For example, the partial pressure of the cation precursor gas/gases may be between one and hundred times greater than the partial pressure of the anion precursor gases, including all values and ranges therein. For deposition of the positive fixed charge dielectric liner as described herein, the cation precursor gases may include one or more metal-containing precursors bound by a non-metallic element such as e.g. chlorine, fluorine, bromine, iodine, etc. For example, in some embodiments, the cation precursors may include metal-containing precursors such as beryllium chloride, magnesium chloride, aluminum chloride, hafnium chloride, zirconium chloride, lanthanum chloride, yttrium chloride, scandium chloride, gadolimium chloride, and analogous metal-based precursors bound by fluorine, bromine, iodine, etc. In other embodiments, the cation precursors may include metal-based carbon/hydrogen containing precursors, including but not limited to metal-containing amidinates and actinates.

Doping with impurity atoms that lead to positive fixed charge may be performed by in-situ doping during the CVD or ALD growth of the fixed charge layer. Impurity atoms that lead to positive fixed charge can be incorporated into the dielectric material being grown through introduction of impurity-level quantities of dopant-containing precursor gases during the growth, and controlled through the partial pressure of such gasses. When the selected dielectric material is an oxide or a silicate, suitable dopant atoms to be provided in a dopant-containing precursor gas in process 2004 may include, but are not limited to fluorine, chlorine, bromine, etc (i.e. halogens). When the selected dielectric material is a nitride, suitable dopant atoms to be provided in a dopant-containing precursor gas in process 2004 may include, but are not limited to oxygen, sulfur, selenium, etc (i.e. elements from the oxygen group of the periodic table). When the selected dielectric material is a carbide, suitable dopant atoms to be provided in a dopant-containing precursor gas in process 2004 may include, but are not limited to nitrogen, phosphorus, arsenic, etc. (i.e. elements from the nitrogen group of the periodic table).

Providing the hydrogen ambient growth in process 2004 may be performed by incorporating atomic hydrogen into the dielectric material during growth. This is can be done by providing a negatively charged hydrogen ambient during growth (ex. hydrogen gas, PE-atomic hydrogen, water, etc.). The amphoteric nature of atomic hydrogen will allow it to cancel out the charge of intentionally incorporated positively charged defects and impurities. This hydrogen-induced charge stabilization may lead to more favorable conditions for incorporation of positively charged defects and impurities, as they are neutralized by atomic hydrogen.

After the deposition of the dielectric material is finished, the deposited dielectric material layer is annealed, at 2006, in order to drive the incorporated negative hydrogen atoms away from the deposited dielectric material, leaving behind positive fixed charges. For example, annealing may be carried out by heating up the substrate to 200-600 degrees Celsius, for 1-120 minutes. Dielectric materials having their oxygen coordination being equal to or greater than four will be more suitable for the application of this hydrogen strategy for incorporation of positive fixed charge, including, but not limited to beryllium oxide, magnesium oxide, boron nitride, aluminum nitride, silicon carbide, etc.

FIG. 13 is a flow diagram of an example method 3000 of providing a negative fixed charge dielectric liner, in accordance with various embodiments. The method 3000 may be used to form a negative fixed charge dielectric material that can be used as the fixed charge liner 130 described herein.

As described above, negative fixed charges can be created in a dielectric material having sufficiently large valence band offset with respect to a subfin material used (i.e. so that there is a sufficient number of occupied electron states of acceptor type in the fixed charge dielectric material/232 which are lower in energy than the top valence band of the subfin 116 material). Therefore, the method 3000 may begin at 3002, with selecting a dielectric material having a sufficiently large valence band offset from that of the semiconductor material selected as the material for the subfin 116. In some embodiments, any dielectric material having a valence band offset greater than zero may be selected. In some embodiments, the dielectric material selected at 3002 has a valence band offset greater than 1 eV, e.g. greater than 2 eV or greater than 3 eV. Sufficient valence band offset between the selected dielectric and subfin materials ensures that, by applying the growth processing of the selected dielectric material as described below, negative fixed charge can be incorporated into the dielectric material. Dielectric materials that could be used for forming negative fixed charge dielectric materials include, but are not limited to oxides (ex. beryllium oxide, magnesium oxide, aluminum oxide, hafnium oxide, zirconium oxide, lanthanum oxide, yttrium oxide, scandium oxide, gadolinium oxide, etc.), nitrides (ex. boron nitride, aluminum nitride, silicon nitride, etc.), carbides (wide-bandgap polytypes of silicon carbide, ex. 2H and 4H, etc.), and silicates (ex. hafnium silicate, zirconium silicate, etc.).

At 3004, the method 3000 may proceed with the deposition of the selected dielectric material, e.g. using CDV or ALD, under deposition conditions that promote incorporation of negative fixed charges in the dielectric material being grown.

In process 3004, the substrate placed in the CVD or ALD reaction chamber may be e.g. the assembly 202 shown in FIG. 8, similar to the substrate places in the chamber in process 2004 described above. The layer of solid thin film material deposited on the surface of such a substrate due to reaction of gasses in the reaction chamber is the layer of the negative fixed charge dielectric material as described herein. A selection of particular one or more anion precursor gases would depend on the dielectric material selected in process 3002. Deposition conditions that promote incorporation of negative fixed charges, e.g. in the form of native point defects or/and impurities, may include providing anion-rich environment in the reaction chamber, doping of the dielectric material being grown with negatively charged impurity atoms, and adding positively charged hydrogen atoms to the reaction chamber (i.e. providing hydrogen ambient growth).

In some embodiments, providing anion-rich growth conditions may include ensuring that the partial pressure of anion-precursor species in the reaction chamber is at or above a certain threshold, the threshold being provided either as an absolute value or a value relative to partial pressure of other gasses in the chamber, e.g. of the cation-precursor gases. In some embodiments, establishing anion-rich growth conditions may include ensuring that the partial pressure of the anion precursor gas/gases is greater than the partial pressure of the cation precursor gases. For example, the partial pressure of the anion precursor gas/gases may be between one and hundred times greater than the partial pressure of the cation precursor gases, including all values and ranges therein. For deposition of the negative fixed charge dielectric layer as described herein, the anion precursor gases may include one or more of oxygen-containing precursors (e.g. oxygen gas, water, hydrogen peroxide, etc.), nitrogen-containing precursors (e.g. nitrogen gas, ammonia, nitrous oxide, etc.), or carbon-containing precursors (e.g. carbon dioxide, carbon monoxide, methane, etc.).

Doping with impurity atoms that lead to negative fixed charge may be performed by in-situ doping during the CVD or ALD growth of the fixed charge layer. Impurity atoms that lead to negative fixed charge can be incorporated into the dielectric material being grown through introduction of impurity-level quantities of dopant-containing precursor gases during the growth, and controlled through the partial pressure of such gasses. When the selected dielectric material is an oxide or a silicate, suitable dopant atoms to be provided in a dopant-containing precursor gas in process 3004 may include, but are not limited to nitrogen, phosphorus, arsenic, etc (i.e. elements from the nitrogen group of the periodic table). When the selected dielectric material is a nitride, suitable dopant atoms to be provided in a dopant-containing precursor gas in process 3004 may include, but are not limited to carbon, silicon, germanium, etc (i.e. elements from the carbon group of the periodic table). When the selected dielectric material is a carbide, suitable dopant atoms to be provided in a dopant-containing precursor gas in process 3004 may include, but are not limited to boron, aluminum, gallium, etc (i.e. elements from the boron group of the periodic table).

Providing the hydrogen ambient growth in process 3004 may be performed by incorporating atomic hydrogen into the dielectric material during growth. This is can be done by providing a positively charged hydrogen ambient during growth (ex. hydrogen gas, PE-atomic hydrogen, water, etc.). The amphoteric nature of atomic hydrogen will allow it to cancel out the charge of intentionally incorporated negatively charged defects and impurities. This hydrogen-induced charge stabilization may lead to more favorable conditions for incorporation of negatively charged defects and impurities, as they are neutralized by atomic hydrogen.

After the deposition of the dielectric material is finished, the deposited dielectric material layer is annealed, at 3006, in order to drive the incorporated positive hydrogen atoms away from the deposited dielectric material, leaving behind negative fixed charges. For example, annealing may be carried out by heating up the substrate to 200-600 degrees Celsius, for 1-120 minutes.

The tri-gate transistor arrangements disclosed herein may be included in any suitable electronic device. FIGS. 14-17 illustrate various examples of apparatuses that may include one or more of the tri-gate transistor arrangements with fixed charge liners in their subfin dielectric stacks disclosed herein.

Figure 14A:
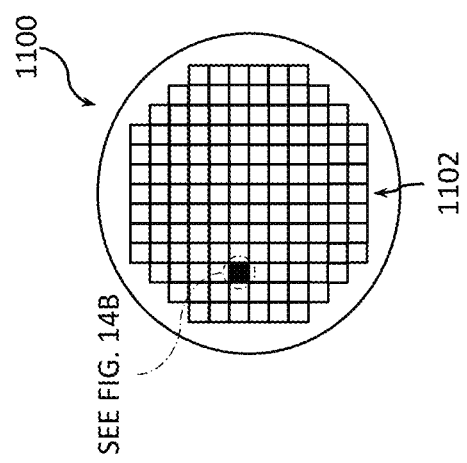
FIGS. 14A and 14B are top views of a wafer and dies that include one or more tri-gate transistors having a fixed charge liner in accordance with any of the embodiments disclosed herein.
Figure 14B:
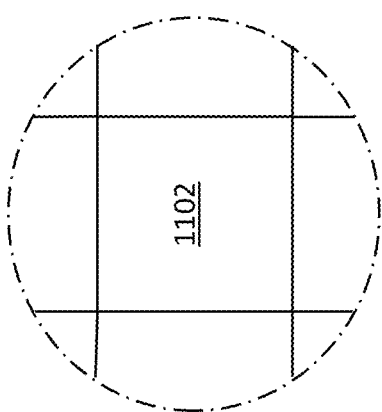

FIGS. 14A-B are top views of a wafer 1100 and dies 1102 that may include one or more tri-gate transistor arrangements with fixed charge liners in accordance with any of the embodiments disclosed herein. The wafer 1100 may be composed of semiconductor material and may include one or more dies 1102 having IC structures formed on a surface of the wafer 1100. Each of the dies 1102 may be a repeating unit of a semiconductor product that includes any suitable IC (e.g., ICs including one or more arrangements 100. After the fabrication of the semiconductor product is complete (e.g., after manufacture of one or more arrangements 100 with fixed charge liners 130), the wafer 1100 may undergo a singulation process in which each of the dies 1102 is separated from one another to provide discrete "chips" of the semiconductor product. In particular, devices that include one or more tri-gate transistor arrangements with fixed charge liners as disclosed herein may take the form of the wafer 1100 (e.g., not singulated) or the form of the die 1102 (e.g., singulated). The die 1102 may include two or more transistors (e.g., two or more of the transistors 1240 of FIG. 15, discussed below) having fixed charge liners, which may take the form of any of the transistor 101 and the fixed charge liner 130 in the arrangement 100, and/or supporting circuitry to route electrical signals to the transistors, as well as any other IC components. In some embodiments, the wafer 1100 or the die 1102 may include a memory device (e.g., a static random access memory (SRAM) device), a logic device (e.g., an AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 1402 of FIG. 17) or other logic that is configured to store information in the memory devices or execute instructions stored in the memory array.

Figure 15:
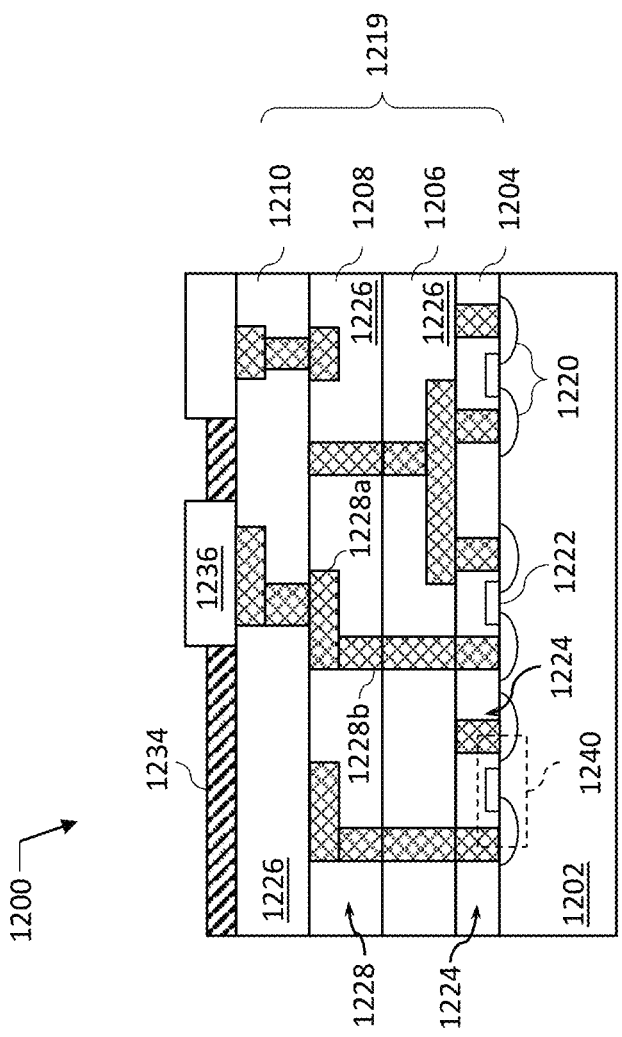
FIG. 15 is a cross-sectional side view of an integrated circuit (IC) device that may include one or more tri-gate transistors having a fixed charge liner in accordance with any of the embodiments disclosed herein.

FIG. 15 is a cross-sectional side view of an IC device 1200 that may include one or more tri-gate transistor arrangements with fixed charge liners in accordance with any of the embodiments disclosed herein. The IC device 1200 may be formed on a substrate 1202 (e.g., the wafer 1100 of FIG. 14A) and may be included in a die (e.g., the die 1102 of FIG. 14B). The substrate 1202 may be a semiconductor substrate composed of semiconductor material systems including, for example, N-type or P-type materials systems. The substrate 1202 may include, for example, a crystalline substrate formed using a bulk silicon or a silicon-on-insulator substructure. In some embodiments, the semiconductor substrate 1202 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the substrate 1202. Although a few examples of materials from which the substrate 1202 may be formed are described here, any material that may serve as a foundation for an IC device 1200 may be used. The substrate 1202 may be part of a singulated die (e.g., the dies 1102 of FIG. 14B) or a wafer (e.g., the wafer 1100 of FIG. 14A).

The IC device 1200 may include one or more device layers 1204 disposed on the substrate 1202. The device layer 1204 may include features of one or more transistors 1240 (e.g., metal oxide semiconductor field-effect transistors (MOSFETs)) formed on the substrate 1202. The device layer 1204 may include, for example, one or more source and/or drain (S/D) regions 1220, a gate 1222 to control current flow in the transistors 1240 between the S/D regions 1220, and one or more S/D contacts 1224 to route electrical signals to/from the S/D regions 1220. The transistors 1240 may include additional features not depicted for the sake of clarity, such as device isolation regions, gate contacts, and the like. The transistors 1240 are not limited to the type and configuration depicted in FIG. 15 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors. In particular, one or more of the transistors 1240 may be include fixed charge liners 130 in accordance with any of the embodiments disclosed herein. The S/D regions 1220 may include the source region 120 and the drain region 122 as described above. Transistors with fixed charge liners 130 may be particularly advantageous when used in the metal layers of a microprocessor device for analog circuitry, logic circuitry, or memory circuitry, and may be formed along with existing complementary metal oxide semiconductor (CMOS) processes.

Each transistor 1240 may include a gate 1222 formed of at least two layers, a gate dielectric layer and a gate electrode layer. The gate electrode layer may take the form of any of the embodiments of the gate electrode material 108/208 disclosed herein. Generally, the gate dielectric layer of a transistor 1240 may include one layer or a stack of layers, and the one or more layers may include silicon oxide, silicon dioxide, and/or a high-k dielectric material. The high-k dielectric material included in the gate dielectric layer of the transistor 1240 may take the form of any of the embodiments of the high-k dielectric 110 disclosed herein, for example.

In some embodiments, when viewed as a cross section of the transistor 1240 along the source-channel-drain direction, the gate electrode may consist of a U-shaped structure that includes a bottom portion substantially parallel to the surface of the substrate and two sidewall portions that are substantially perpendicular to the top surface of the substrate (e.g., as discussed above with reference to the tri-gate transistor 101 of FIGS. 1 and 3-6). In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers. In some embodiments, the gate electrode may consist of a V-shaped structure (e.g., when the fin 112 does not have a "flat" upper surface, but instead has a rounded peak).

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1220 may be formed adjacent to the gate 1222 of each transistor 1240. The S/D regions 1220 may take the form of any of the embodiments of the source region 120 and the drain region 122 discussed above with reference to the transistor 101. In other embodiments, the S/D regions 1220 may be formed using any suitable processes known in the art. For example, the S/D regions 1220 may be formed using either an implantation/diffusion process or a deposition process. In the former process, dopants such as boron, aluminum, antimony, phosphorous, or arsenic may be ion-implanted into the substrate 1202 to form the S/D regions 1220. An annealing process that activates the dopants and causes them to diffuse farther into the substrate 1202 may follow the ion implantation process. In various embodiments, the S/D regions 1220 can be created by either ion implantation into the fin (for the tri-gate architectures) or the wire (for the all-around-gate architectures), or in-situ doping in an epitaxial deposition followed by an S/D etch of the fin or the wire, or a combination of both. In the latter process, an epitaxial deposition process may provide material that is used to fabricate the S/D regions 1220. In some implementations, the S/D regions 1220 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1220 may be formed using one or more alternate semiconductor materials such as germanium or a group III-V material or alloy. In further embodiments, one or more layers of metal and/or metal alloys may be used to form the S/D regions 1220 (e.g., as discussed above with reference to the source region 120 and the drain region 122). In some embodiments, an etch process may be performed before the epitaxial deposition to create recesses in the substrate 1202 in which the material for the S/D regions 1220 is deposited.

Electrical signals, such as power and/or input/output (I/O) signals, may be routed to and/or from the transistors 1240 of the device layer 1204 through one or more interconnect layers disposed on the device layer 1204 (illustrated in FIG. 15 as interconnect layers 1206-1210). For example, electrically conductive features of the device layer 1204 (e.g., the gate 1222 and the S/D contacts 1224) may be electrically coupled with the interconnect structures 1228 of the interconnect layers 1206-1210. The one or more interconnect layers 1206-1210 may form an interlayer dielectric (ILD) stack 1219 of the IC device 1200.

The interconnect structures 1228 may be arranged within the interconnect layers 1206-1210 to route electrical signals according to a wide variety of designs (in particular, the arrangement is not limited to the particular configuration of interconnect structures 1228 depicted in FIG. 15). Although a particular number of interconnect layers 1206-1210 is depicted in FIG. 15, embodiments of the present disclosure include IC devices having more or fewer interconnect layers than depicted.

In some embodiments, the interconnect structures 1228 may include trench structures 1228a (sometimes referred to as "lines") and/or via structures 1228b (sometimes referred to as "holes") filled with an electrically conductive material such as a metal. The trench structures 1228a may be arranged to route electrical signals in a direction of a plane that is substantially parallel with a surface of the substrate 1202 upon which the device layer 1204 is formed. For example, the trench structures 1228a may route electrical signals in a direction in and out of the page from the perspective of FIG. 15. The via structures 1228b may be arranged to route electrical signals in a direction of a plane that is substantially perpendicular to the surface of the substrate 1202 upon which the device layer 1204 is formed. In some embodiments, the via structures 1228b may electrically couple trench structures 1228a of different interconnect layers 1206-1210 together.

The interconnect layers 1206-1210 may include a dielectric material 1226 disposed between the interconnect structures 1228, as shown in FIG. 15. In some embodiments, the dielectric material 1226 disposed between the interconnect structures 1228 in different ones of the interconnect layers 1206-1210 may have different compositions; in other embodiments, the composition of the dielectric material 1226 between different interconnect layers 1206-1210 may be the same.

A first interconnect layer 1206 (referred to as Metal 1 or "M1") may be formed directly on the device layer 1204. In some embodiments, the first interconnect layer 1206 may include trench structures 1228a and/or via structures 1228b, as shown. The trench structures 1228a of the first interconnect layer 1206 may be coupled with contacts (e.g., the S/D contacts 1224) of the device layer 1204.

A second interconnect layer 1208 (referred to as Metal 2 or "M2") may be formed directly on the first interconnect layer 1206. In some embodiments, the second interconnect layer 1208 may include via structures 1228b to couple the trench structures 1228a of the second interconnect layer 1208 with the trench structures 1228a of the first interconnect layer 1206. Although the trench structures 1228a and the via structures 1228b are structurally delineated with a line within each interconnect layer (e.g., within the second interconnect layer 1208) for the sake of clarity, the trench structures 1228a and the via structures 1228b may be structurally and/or materially contiguous (e.g., simultaneously filled during a dual-damascene process) in some embodiments.

A third interconnect layer 1210 (referred to as Metal 3 or "M3") (and additional interconnect layers, as desired) may be formed in succession on the second interconnect layer 1208 according to similar techniques and configurations described in connection with the second interconnect layer 1208 or the first interconnect layer 1206.

The IC device 1200 may include a solder resist material 1234 (e.g., polyimide or similar material) and one or more bond pads 1236 formed on the interconnect layers 1206-1210. The bond pads 1236 may be electrically coupled with the interconnect structures 1228 and configured to route the electrical signals of the transistor(s) 1240 to other external devices. For example, solder bonds may be formed on the one or more bond pads 1236 to mechanically and/or electrically couple a chip including the IC device 1200 with another component (e.g., a circuit board). The IC device 1200 may have other alternative configurations to route the electrical signals from the interconnect layers 1206-1210 than depicted in other embodiments. For example, the bond pads 1236 may be replaced by or may further include other analogous features (e.g., posts) that route the electrical signals to external components.

Figure 16:
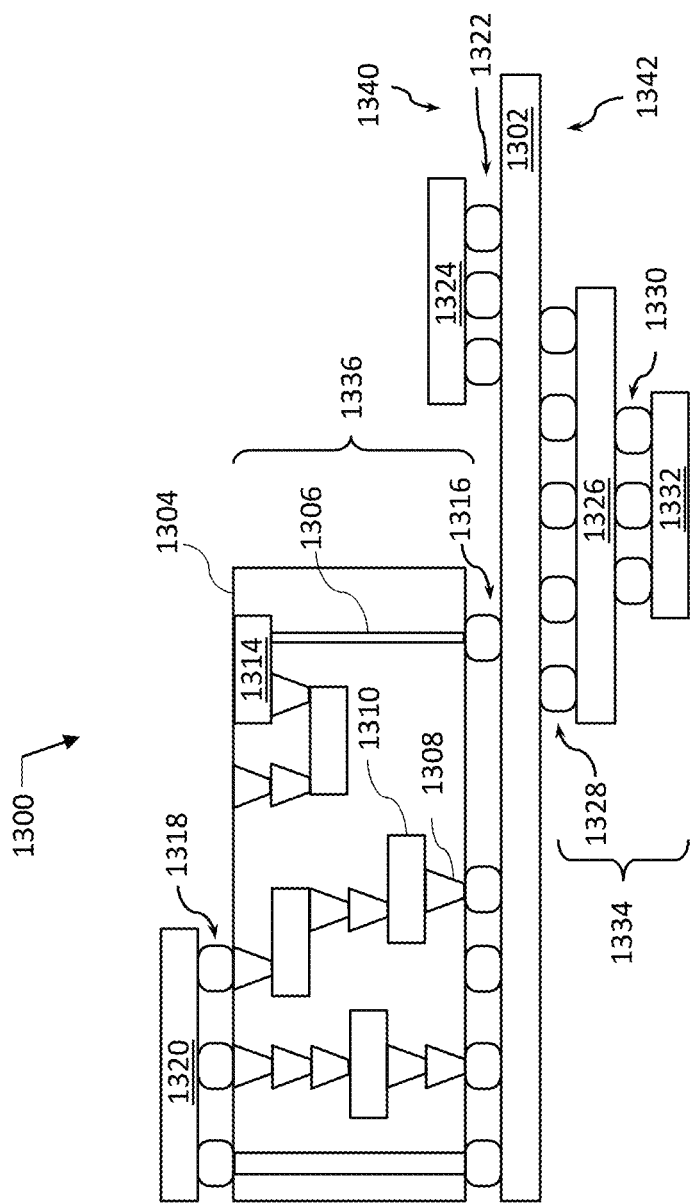
FIG. 16 is a cross-sectional side view of an IC device assembly that may include one or more tri-gate transistors having a fixed charge liner in accordance with any of the embodiments disclosed herein.

FIG. 16 is a cross-sectional side view of an IC device assembly 1300 that may include components having one or more tri-gate and all-around-gate arrangements with device isolation structures in accordance with any of the embodiments disclosed herein. The IC device assembly 1300 includes a number of components disposed on a circuit board 1302 (which may be, e.g., a motherboard). The IC device assembly 1300 includes components disposed on a first face 1340 of the circuit board 1302 and an opposing second face 1342 of the circuit board 1302; generally, components may be disposed on one or both faces 1340 and 1342. In particular, any suitable ones of the components of the IC device assembly 1300 may include any of the tri-gate arrangements 100 with fixed charge liners 130 disclosed herein.

In some embodiments, the circuit board 1302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1302. In other embodiments, the circuit board 1302 may be a non-PCB substrate.

The IC device assembly 1300 illustrated in FIG. 16 includes a package-on-interposer structure 1336 coupled to the first face 1340 of the circuit board 1302 by coupling components 1316. The coupling components 1316 may electrically and mechanically couple the package-on-interposer structure 1336 to the circuit board 1302, and may include solder balls (as shown in FIG. 16), male and female portions of a socket, an adhesive, an underfill material, and/or any other suitable electrical and/or mechanical coupling structure.

The package-on-interposer structure 1336 may include an IC package 1320 coupled to an interposer 1304 by coupling components 1318. The coupling components 1318 may take any suitable form for the application, such as the forms discussed above with reference to the coupling components 1316. Although a single IC package 1320 is shown in FIG. 16, multiple IC packages may be coupled to the interposer 1304; indeed, additional interposers may be coupled to the interposer 1304. The interposer 1304 may provide an intervening substrate used to bridge the circuit board 1302 and the IC package 1320. The IC package 1320 may be or include, for example, a die (the die 1102 of FIG. 14B), an IC device (e.g., the IC device 1200 of FIG. 15), or any other suitable component. Generally, the interposer 1304 may spread a connection to a wider pitch or reroute a connection to a different connection. For example, the interposer 1304 may couple the IC package 1320 (e.g., a die) to a ball grid array (BGA) of the coupling components 1316 for coupling to the circuit board 1302. In the embodiment illustrated in FIG. 16, the IC package 1320 and the circuit board 1302 are attached to opposing sides of the interposer 1304; in other embodiments, the IC package 1320 and the circuit board 1302 may be attached to a same side of the interposer 1304. In some embodiments, three or more components may be interconnected by way of the interposer 1304.

The interposer 1304 may be formed of an epoxy resin, a fiberglass-reinforced epoxy resin, a ceramic material, or a polymer material such as polyimide. In some implementations, the interposer 1304 may be formed of alternate rigid or flexible materials that may include the same materials described above for use in a semiconductor substrate, such as silicon, germanium, and other group III-V and group IV materials. The interposer 1304 may include metal interconnects 1308 and vias 1310, including but not limited to through-silicon vias (TSVs) 1306. The interposer 1304 may further include embedded devices 1314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 1304. The package-on-interposer structure 1336 may take the form of any of the package-on-interposer structures known in the art.

The IC device assembly 1300 may include an IC package 1324 coupled to the first face 1340 of the circuit board 1302 by coupling components 1322. The coupling components 1322 may take the form of any of the embodiments discussed above with reference to the coupling components 1316, and the IC package 1324 may take the form of any of the embodiments discussed above with reference to the IC package 1320.

The IC device assembly 1300 illustrated in FIG. 16 includes a package-on-package structure 1334 coupled to the second face 1342 of the circuit board 1302 by coupling components 1328. The package-on-package structure 1334 may include an IC package 1326 and an IC package 1332 coupled together by coupling components 1330 such that the IC package 1326 is disposed between the circuit board 1302 and the IC package 1332. The coupling components 1328 and 1330 may take the form of any of the embodiments of the coupling components 1316 discussed above, and the IC packages 1326 and 1332 may take the form of any of the embodiments of the IC package 1320 discussed above. The package-on-package structure 1334 may be configured in accordance with any of the package-on-package structures known in the art.

Figure 17:
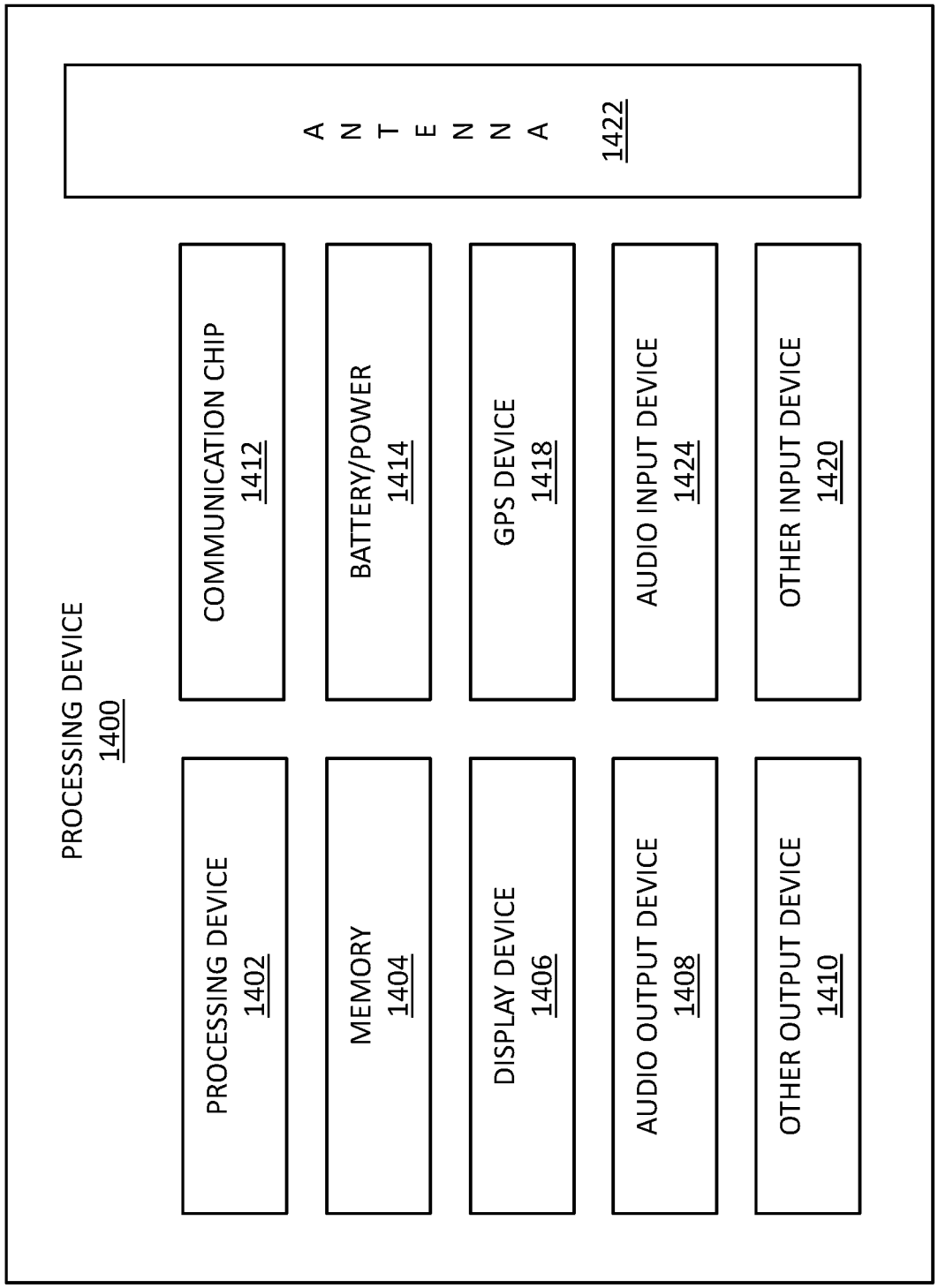
FIG. 17 is a block diagram of an example computing device that may include one or more tri-gate transistors having a fixed charge liner in accordance with any of the embodiments disclosed herein.

FIG. 17 is a block diagram of an example computing device 1400 that may include one or more components including one or more tri-gate transistor arrangements with fixed charge liners in accordance with any of the embodiments disclosed herein. For example, any suitable ones of the components of the computing device 1400 may include a die (e.g., the die 1102 (FIG. 14B)) having one or more transistors 101 with fixed charge liners 130. Any one or more of the components of the computing device 1400 may include, or be included in, an IC device 1200 (FIG. 15). Any one or more of the components of the computing device 1400 may include, or be included in, an IC device assembly 1300 (FIG. 16).

A number of components are illustrated in FIG. 17 as included in the computing device 1400, but any one or more of these components may be omitted or duplicated, as suitable for the application. In some embodiments, some or all of the components included in the computing device 1400 may be attached to one or more motherboards. In some embodiments, some or all of these components are fabricated onto a single system-on-a-chip (SoC) die.

Additionally, in various embodiments, the computing device 1400 may not include one or more of the components illustrated in FIG. 17, but the computing device 1400 may include interface circuitry for coupling to the one or more components. For example, the computing device 1400 may not include a display device 1406, but may include display device interface circuitry (e.g., a connector and driver circuitry) to which a display device 1406 may be coupled. In another set of examples, the computing device 1400 may not include an audio input device 1424 or an audio output device 1408, but may include audio input or output device interface circuitry (e.g., connectors and supporting circuitry) to which an audio input device 1424 or audio output device 1408 may be coupled.

The computing device 1400 may include a processing device 1402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1402 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 1400 may include a memory 1404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1404 may include memory that shares a die with the processing device 1402. This memory may be used as cache memory and may include embedded dynamic random access memory (eDRAM) or spin transfer torque magnetic random-access memory (STT-M RAM).

In some embodiments, the computing device 1400 may include a communication chip 1412 (e.g., one or more communication chips). For example, the communication chip 1412 may be configured for managing wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1412 may operate in accordance with other wireless protocols in other embodiments. The computing device 1400 may include an antenna 1422 to facilitate wireless communications and/or to receive other wireless communications (such as AM or FM radio transmissions).

In some embodiments, the communication chip 1412 may manage wired communications, such as electrical, optical, or any other suitable communication protocols (e.g., the Ethernet). As noted above, the communication chip 1412 may include multiple communication chips. For instance, a first communication chip 1412 may be dedicated to shorter-range wireless communications such as Wi-Fi or Bluetooth, and a second communication chip 1412 may be dedicated to longer-range wireless communications such as GPS, EDGE, GPRS, CDMA, WiMAX, LTE, EV-DO, or others. In some embodiments, a first communication chip 1412 may be dedicated to wireless communications, and a second communication chip 1412 may be dedicated to wired communications.

The computing device 1400 may include battery/power circuitry 1414. The battery/power circuitry 1414 may include one or more energy storage devices (e.g., batteries or capacitors) and/or circuitry for coupling components of the computing device 1400 to an energy source separate from the computing device 1400 (e.g., AC line power).

The computing device 1400 may include a display device 1406 (or corresponding interface circuitry, as discussed above). The display device 1406 may include any visual indicators, such as a heads-up display, a computer monitor, a projector, a touchscreen display, a liquid crystal display (LCD), a light-emitting diode display, or a flat panel display, for example.

The computing device 1400 may include an audio output device 1408 (or corresponding interface circuitry, as discussed above). The audio output device 1408 may include any device that generates an audible indicator, such as speakers, headsets, or earbuds, for example.

The computing device 1400 may include an audio input device 1424 (or corresponding interface circuitry, as discussed above). The audio input device 1424 may include any device that generates a signal representative of a sound, such as microphones, microphone arrays, or digital instruments (e.g., instruments having a musical instrument digital interface (MIDI) output).

The computing device 1400 may include a global positioning system (GPS) device 1418 (or corresponding interface circuitry, as discussed above). The GPS device 1418 may be in communication with a satellite-based system and may receive a location of the computing device 1400, as known in the art.

The computing device 1400 may include another output device 1410 (or corresponding interface circuitry, as discussed above). Examples of the other output device 1410 may include an audio codec, a video codec, a printer, a wired or wireless transmitter for providing information to other devices, or an additional storage device.

The computing device 1400 may include another input device 1420 (or corresponding interface circuitry, as discussed above). Examples of the other input device 1420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1400 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1400 may be any other electronic device that processes data.

The following paragraphs provide various examples of the embodiments disclosed herein.

Example 1 provides a tri-gate transistor arrangement, including a fin stack and a subfin dielectric stack. The fin stack is shaped as a fin extending away from a base, the fin including a subfin portion and a channel portion, the subfin portion being closer to the base than the channel portion. The subfin dielectric stack includes a transistor dielectric material and a fixed charge liner material disposed between the transistor dielectric material and the subfin portion of the fin.

Example 2 provides the tri-gate transistor arrangement according to Example 1, where the fixed charge liner material includes a material having a higher concentration of fixed charges than a concentration of fixed charges in the transistor dielectric material.

Example 3 provides the tri-gate transistor arrangement according to Examples 1 or 2, where the fixed charge liner material has a thickness between 2 nanometers and 20 nanometers.

Example 4 provides the tri-gate transistor arrangement according to any one of the preceding Examples, where the fixed charge liner material is in contact with the subfin portion and/or with the transistor dielectric material.

Example 5 provides the tri-gate transistor arrangement according to any one of the preceding Examples, where the fixed charge liner material includes a dielectric material having a concentration of fixed charges greater than $5^{12}$ per square centimeter.

Example 6 provides the tri-gate transistor arrangement according to any one of the preceding Examples, where the fixed charges are positive fixed charges when the tri-gate transistor arrangement is included in a P-type transistor.

Example 7 provides the tri-gate transistor arrangement according to any one of the preceding Examples, where the fixed charges are negative fixed charges when the tri-gate transistor arrangement is included in an N-type transistor.

Example 8 provides a transistor. The transistor includes a fin stack of one or more semiconductor materials disposed over a substrate, the fin stack shaped as a fin extending away from the substrate, the fin including a subfin portion and a channel portion, the subfin portion being closer to the substrate than the channel portion; a subfin dielectric stack disposed on at least parts of one or more sidewalls of the subfin portion, the subfin dielectric stack including a transistor dielectric material and a fixed charge liner material disposed between the transistor dielectric material and the subfin portion; a source region; a drain region; and a gate.

Example 9 provides the transistor according to Example 8, where the fixed charge liner material includes a dielectric material having a concentration of fixed charges greater than $5^{12}$ per square centimeter.

Example 10 provides the transistor according to Examples 8 or 9, where the fixed charges are positive fixed charges and the transistor is a P-type transistor.

Example 11 provides the transistor according to Examples 8 or 9, where the fixed charges are negative fixed charges and the transistor is an N-type transistor.

Example 12 provides the transistor according to any one of Examples 8-11, where the gate partially wraps around the channel portion of the fin.

Example 13 provides the transistor according to any one of Examples 8-12, where the gate has a gate length between 20 and 40 nanometers.

Example 14 provides the transistor according to any one of Examples 8-13, where the fixed charge liner material includes a material having a higher concentration of fixed charges than a concentration of fixed charges in the transistor dielectric material.

Example 15 provides the transistor according to any one of Examples 8-14, where the fixed charge liner material has a thickness between 2 nanometers and 20 nanometers.

Example 16 provides the transistor according to any one of Examples 8-15, where the fixed charge liner material is in contact with the subfin portion and/or with the transistor dielectric material.

Example 17 provides a computing device. The computing device includes a substrate and an integrated circuit (IC) die coupled to the substrate. The IC die includes a transistor having a fin stack of one or more semiconductor materials disposed over the substrate and a subfin dielectric stack disposed on at least parts of one or more sidewalls of a portion of the fin stack and the subfin dielectric stack includes a transistor dielectric material and a fixed charge liner material disposed between the transistor dielectric material and the portion of the fin stack.

Example 18 provides the computing device according to Example 17, where the fin stack is shaped as a fin extending away from the substrate, the fin including a subfin portion and a channel portion, the subfin portion being closer to the substrate than the channel portion, and where the portion of the fin stack is the subfin portion.

Example 19 provides the computing device according to Examples 17 or 18, where the computing device is a wearable or handheld computing device.

Example 20 provides the computing device according to any one of Examples 17-19, where the computing device further includes one or more communication chips and an antenna.

Example 21 provides a method of manufacturing a transistor device. The method includes providing a fin stack including one or more semiconductor materials over a substrate, the fin stack shaped as a fin extending away from the substrate, the fin including a subfin portion and a channel portion, the subfin portion being closer to the substrate than the channel portion; providing a fixed charge liner on at least parts of one or more sidewalls of the subfin portion; and providing a transistor dielectric material over the fixed charge liner.

Example 22 provides the method according to Example 21, where providing the fixed charge liner includes performing chemical vapor deposition (CVD) or atomic layer deposition (ALD) to deposit, on at least parts of one or more sidewalls of the subfin portion, a dielectric material having a conduction band offset with respect to a material of the subfin portion of at least 2 electron-volts, ensuring that, during the deposition, a partial pressure of cation-precursor species in a reaction chamber of the deposition is greater than a partial pressure of cation-precursor species in the reaction chamber; providing negatively charged hydrogen atoms to the reaction chamber during the deposition; and, after the deposition, annealing the substrate for a time sufficient to drive away at least 80% of the negatively charged hydrogen atoms incorporated in the fixed charge liner.

Example 23 provides the method according to Example 22, where the cation-precursor species include one or more of metal-based precursors bound by a halogen, metal-containing amidinates, or metal-containing actinates.

Example 24 provides the method according to Examples 22 or 23, where providing the fixed charge liner further includes providing impurity atoms configured to form positive fixed charges to the reaction chamber during the deposition.

Example 25 provides the method according to Example 24, where the impurity atoms include halogens when the fixed charge liner is a silicate, the impurity atoms include oxygen group elements when the fixed charge liner is a nitride, and the impurity atoms include nitrogen group elements when the fixed charge liner is a carbide.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

The invention claimed is:

1. An integrated circuit (IC) device, comprising:
a transistor arrangement that includes:
a fin stack of one or more semiconductor materials having a shape of a fin extending away from a base, the fin comprising a subfin portion and a channel portion, the subfin portion being closer to the base than the channel portion;
a gate wrapping around the channel portion of the fin;
a liner on sidewalls of the subfin portion of the fin; and
an insulator material surrounding the sidewalls,
wherein the liner includes fixed charges and is between the sidewalls and the insulator material, the insulator material is in contact with the base, and a portion of the liner that is farthest away from the base is at a same distance from the base as a portion of the gate that is closest to the base.

2. The IC device according to claim 1, wherein the liner comprises a material having a higher concentration of fixed charges than a concentration of fixed charges in the insulator material.

3. The IC device according to claim 1, wherein the liner has a thickness between 2 nanometers and 20 nanometers.

4. The IC device according to claim 1, wherein the liner is in contact with at least one of the subfin portion and the insulator material.

5. The IC device according to claim 1, wherein the liner comprises a dielectric material having a concentration of fixed charges greater than $5^{12}$ fixed charges per square centimeter.

6. The IC device according to claim 5, wherein the fixed charges are positive fixed charges when the transistor arrangement is a part of a P-type transistor.

7. The IC device according to claim 5, wherein the fixed charges are negative fixed charges when the transistor arrangement is a part of an N-type transistor.

8. The IC device according to claim 1, wherein the liner is one of a silicate, a nitride, or a carbide.

9. The IC device according to claim 1, wherein:
the IC device is an IC package comprising an IC die and a further component coupled to the IC die,
the IC die includes the transistor arrangement, and
the further component includes one of a package substrate, a carrier substrate, an interposer, or a further IC die.

10. The IC device according to claim 9, further comprising first-level interconnects to couple the further component and the IC die.

11. The IC device according to claim 1, wherein the liner is in contact with a gate dielectric or a gate electrode of the gate.

12. A transistor, comprising:
a fin stack of one or more semiconductor materials over a substrate, the fin stack having a shape of a fin extending away from the substrate, the fin comprising a subfin portion and a channel portion, the subfin portion being closer to the substrate than the channel portion;
a subfin dielectric stack over at least parts of one or more sidewalls of the subfin portion, the subfin dielectric stack comprising:
an insulator material, and
a fixed charge liner material between the insulator material and the subfin portion,
wherein the fixed charge liner material is absent in areas between the substrate and the insulator material;
a source region;
a drain region; and
a gate, wherein a bottom portion of the gate is aligned with a top portion of the fixed charge liner material.

13. The transistor according to claim 12, wherein the fixed charge liner material comprises a dielectric material having a concentration of fixed charges greater than $5^{12}$ fixed charges per square centimeter.

14. The transistor according to claim 13, wherein:
the fixed charges are positive fixed charges when the transistor is a P-type transistor, and
the fixed charges are negative fixed charges when the transistor is an N-type transistor.

15. The transistor according to claim 12, wherein the fixed charge liner material comprises a material having a higher concentration of fixed charges than a concentration of fixed charges in the insulator material.

16. The transistor according to claim 12, wherein the gate includes a gate electrode and a gate dielectric, and wherein the fixed charge liner material is in contact with the gate dielectric.

17. A method of manufacturing a transistor device, comprising:
providing a fin stack comprising one or more semiconductor materials over a substrate, the fin stack shaped as a fin extending away from the substrate, the fin comprising a subfin portion and a channel portion, the subfin portion being closer to the substrate than the channel portion;
providing a liner on at least parts of one or more sidewalls of the subfin portion, wherein the liner includes fixed charges;
providing an insulator material over the liner, wherein the liner is absent between the substrate and the insulator material; and
providing a gate wrapping around the channel portion of the fin, wherein a portion of the liner that is farthest away from the substrate is at a same distance from the substrate as a portion of the gate that is closest to the substrate.

18. The method according to claim 17, wherein providing the liner comprises:
performing chemical vapor deposition (CVD) or atomic layer deposition (ALD) to deposit, on at least parts of one or more sidewalls of the subfin portion, a dielectric material having a conduction band offset with respect to a material of the subfin portion of at least 2 electron-volts,
ensuring that, during the CVD or the ALD, a partial pressure of cation-precursor species in a reaction chamber of the CVD or the ALD is greater than a partial pressure of anion precursor species in the reaction chamber;
providing negatively charged hydrogen atoms to the reaction chamber during the deposition; and after the deposition, annealing the substrate for a time sufficient to drive away at least 80% of the negatively charged hydrogen atoms incorporated in the liner.

19. The method according to claim 18, wherein the cation-precursor species comprise one or more of metal-based precursors bound by a halogen, metal-containing amidinates, or metal-containing actinates.

20. The method according to claim 18, wherein providing the liner further comprises providing impurity atoms configured to form positive fixed charges to the reaction chamber during the deposition, wherein:

the impurity atoms comprise halogens when the liner is a silicate, the impurity atoms comprise oxygen group elements when the liner is a nitride, and the impurity atoms comprise nitrogen group elements when the liner is a carbide.

\* \* \* \* \*